US007755926B2

(12) United States Patent
Tan et al.

(10) Patent No.: US 7,755,926 B2
(45) Date of Patent: Jul. 13, 2010

(54) 3-D SRAM ARRAY TO IMPROVE STABILITY AND PERFORMANCE

(75) Inventors: Yue Tan, Hopewell Junction, NY (US); Huilong Zhu, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 402 days.

(21) Appl. No.: 11/867,877

(22) Filed: Oct. 5, 2007

(65) Prior Publication Data

US 2008/0310207 A1 Dec. 18, 2008

Related U.S. Application Data

(63) Continuation-in-part of application No. 11/762,339, filed on Jun. 13, 2007, now abandoned.

(51) Int. Cl.
*G11C 11/00* (2006.01)
(52) U.S. Cl. ........................ 365/154; 365/201
(58) Field of Classification Search ............. 365/154, 365/201
See application file for complete search history.

(56) References Cited

U.S. PATENT DOCUMENTS

| 4,649,625 | A | * | 3/1987 | Lu ............... | 438/245 |
|---|---|---|---|---|---|
| 4,728,623 | A | * | 3/1988 | Lu et al. ............ | 438/245 |
| 4,866,507 | A | * | 9/1989 | Jacobs et al. ........ | 174/258 |
| 4,988,637 | A | * | 1/1991 | Dhong et al. ........ | 438/245 |
| 5,264,716 | A | * | 11/1993 | Kenney ............. | 257/301 |
| 5,363,327 | A | * | 11/1994 | Henkles et al. ....... | 365/149 |
| 5,365,097 | A | * | 11/1994 | Kenney ............. | 257/302 |
| 5,781,031 | A | * | 7/1998 | Bertin et al. ......... | 326/39 |
| 5,818,748 | A | * | 10/1998 | Bertin et al. ......... | 365/51 |
| 5,862,092 | A | * | 1/1999 | Hawkins et al. ...... | 365/221 |
| 5,986,923 | A | * | 11/1999 | Zhang et al. ......... | 365/154 |
| 5,990,511 | A | * | 11/1999 | Leas ................ | 257/301 |
| 6,037,210 | A | * | 3/2000 | Leas ................ | 438/245 |
| 6,175,533 | B1 | * | 1/2001 | Lee et al. ............ | 365/230.05 |
| 6,939,751 | B2 | * | 9/2005 | Zhu et al. ........... | 438/151 |
| 6,972,461 | B1 | * | 12/2005 | Chen et al. .......... | 257/347 |
| 7,015,082 | B2 | * | 3/2006 | Doris et al. .......... | 438/153 |
| 7,091,566 | B2 | * | 8/2006 | Zhu et al. ........... | 257/401 |
| 7,106,620 | B2 | * | 9/2006 | Chang et al. ......... | 365/154 |
| 2006/0027868 | A1 | * | 2/2006 | Doris et al. .......... | 257/351 |
| 2006/0060925 | A1 | * | 3/2006 | Doris et al. .......... | 257/369 |

* cited by examiner

*Primary Examiner*—Anh Phung
*Assistant Examiner*—Alexander Sofocleous
(74) *Attorney, Agent, or Firm*—Whitham, Curtis, Christofferson & Cook, P.C.; Yuanmin Cai

(57) ABSTRACT

A design structure for a three-dimensional memory circuit provides reduction in memory cell instability due to half-select operation by reduction of the number of memory cells sharing a sense amplifier and, potentially, avoidance of half-select operation by placing some or all peripheral circuits including local evaluation circuits functioning as a type of sense amplifier on an additional chips or chips overlying the memory array. Freedom of placement of such peripheral circuits is provided with minimal increase in connection length since word line decoders may be placed is general registration with any location along the word lines while local evaluation circuits and/or sense amplifiers can be placed at any location generally in registration with the bit line(s) to which they correspond.

15 Claims, 19 Drawing Sheets

3-D SRAM ARRAY TO IMPROVE STABILITY AND PERFORMANCE

CROSS-REFERENCE TO RELATED APPLICATION

This is a continuation-in-part of U.S. patent application Ser. No. 11/762,339 filed Jun. 13, 2007 now abandoned, which is incorporated herein by reference.

DESCRIPTION

Background Of the Invention

1. Field of the Invention

The present invention generally relates to static random access memories (SRAMs) and, more particularly, to design structures for high capacity SRAMs using a half-select mode of addressing and exhibiting corresponding memory cell instability.

2. Description of the Prior Art

Circuits processing digital signals or data have become ubiquitous at the present time, appearing in many electronic devices available to consumers and in industry. Virtually all such processing of digital signals involves a need for storage of the signals at some point in the processing or for control of such processing and many different binary storage structures have been developed and are in widespread use while generally differing among such structures in cost per amount of data stored, memory capacity, access time and operational requirements. Among such structures, so-called static random access memories (SRAMs) are favored for some applications requiring very rapid access even though the number of memory cells is not as great as in other structures such as dynamic random access memories which, on average, have much slower access times due to the manner in which the sense amplifiers therein must operate and the need to periodically refresh the stored data. In SRAMs, there is no need for data refresh and sense amplifier output may be stabilized at a binary value much more quickly since the basic storage cell of an SRAM is a bistable latch circuit.

A bistable latch circuit, sometimes referred to as a flip-flop, can, in theory, be fabricated using only two cross-coupled transistors. However, in practice, particularly using complementary MOSFET (CMOS) technology, it is preferable to form a memory cell of two cross-coupled inverter circuits; requiring four transistors. Further, when such memory cells are formed as an integrated circuit having a dense array of cells, some additional selection transistors are generally required within the array as well as some so-called peripheral or support circuits (which terms will be used interchangeably hereinafter) such as address decoders and sense amplifiers. Therefore, SRAM memory cells at the present time are generally designed using either eight or six transistors (often referred to and 8-T and 6-T cells, respectively).

It should be noted that 6-T memory cells are generally preferred over 8-T designs at the present state of the art notwithstanding some operational problems since the additional two transistors represents a significant penalty in required chip area and total memory array storage capacity when it is common for peripheral circuits to consume approximately half of the available chip area and which roughly halves the number of memory cells that can be formed on a chip of given area.

A principal problem observed in the vast majority of SRAMs using 6-T memory cells is memory cell instability associated with a half-select mode of operation for addressing. (A small fraction of 6-T SRAMs are designed with additional circuitry, having associated cost and chip space penalties, to avoid such a half-select mode but in excess of 95% of 6-T SRAMs currently use the half-select mode due to criticality of cost, capacity and chip space requirements.) This instability arises because sense amplifiers require large transistors to accommodate fan-out and drive current requirements and to produce a good quality output signal with acceptable noise immunity. Therefore, as a matter of economy of chip space usage, sense amplifiers are generally shared between a plurality of bit line pairs corresponding to cells along a row of the memory cell array which may be half-selected by a voltage imposed on a word line; allowing a voltage on the sense amplifier input to be coupled to the memory cell, possibly altering its storage state. This problem of memory cell instability is aggravated by the number of bit line pairs which must share a single sense amplifier; a reduction in which requires a greater number of sense amplifiers consuming greater chip space and compromising any possible increase of memory capacity.

Additionally, it should be appreciated that testing and functionality verification is particularly important in view of the large number of devices included in an SRAM memory array. However, the peripheral circuitry required in a 6-T SRAM complicates and compromises the ability to perform such testing since the memory cells and the peripheral circuits cannot be individually tested without substantial difficulty, if at all.

SUMMARY OF THE INVENTION

It is therefore an object of the present invention to provide a static random access memory structure in which the problem of memory cell instability can be reduced or eliminated altogether while allowing increase of SRAM memory cell capacity on a chip of a given size.

It is a further object of the invention to provide an SRAM structure which can support individual testing and performance verification of an SRAM memory array and peripheral circuits of the SRAM.

Because of the complexity of the SRAMs of the present invention, it is practical to employ a sequence of electronic design automation tools, collectively referred to as a design flow, to automate the design, manufacture, and/or test of the SRAMs of the present invention, as opposed to using a manual design process. The design structure of the present invention, however, is not limited to any specific design flow.

In order to accomplish these and other objects of the invention, a design structure is provided for an integrated circuit memory device including a memory cell array on a first chip, said memory cell array including word lines and bit lines, at least one of word line decoder and sense amplifier type peripheral circuits on a second chip overlying said first chip, at least one of word line decoder and said sense amplifier type peripheral circuits being generally in registration with a portion of a word line or a bit line, respectively, a local evaluation circuit in the first plane or the second plane and electrically connected between bit lines and a sense amplifier, and a connection from a word line or a bit line to a word line decoder or a sense amplifier, respectively, in a direction of a thickness of the first chip.

The present invention thus provides a design structure embodied in a machine readable medium for designing, manufacturing, or testing a design for a design structure comprising an integrated circuit memory device including: a memory cell array on a first chip, said memory cell array including word lines and bit lines; at least one of word line decoder and sense amplifier type peripheral circuits on a second chip overlying said first chip, at least one of word line decoder and said sense amplifier type peripheral circuits being generally in registration with a portion of a word line or a bit line, respectively; a local evaluation circuit in one of said first plane and said second plane and electrically connected between said word lines and a sense amplifier; and a connection from a word line or a bit line to a word line decoder or a sense amplifier, respectively, in a direction of a thickness of said first chip.

The integrated circuit memory device may further include: (i) a local evaluation circuit connected between said bit lines and said sense amplifiers; (ii) a plurality of said local evaluation circuits, means for sharing a said local evaluation circuit between a plurality of said memory cells, and means for selecting a local evaluation circuit of said plurality of local evaluation circuits; (iii) a plurality of said sense amplifiers, means for sharing a said sense amplifier circuit among a plurality of said local evaluation circuits, and means for selecting a said sense amplifier among said plurality of sense amplifiers; and/or (iv) a plurality of said sense amplifiers, means for sharing a said sense amplifier circuit among a plurality of said local evaluation circuits, and means for selecting a said sense amplifier among said plurality of sense amplifiers. The local evaluation circuit may be located on a chip adjacent to the first chip, and the chip adjacent said first chip may be the second chip. The word line decoder peripheral circuits may be located in the second plane and/or in the chip adjacent to the first chip, and the word line peripheral circuits may be located on the same chip as the local evaluation circuit.

The design local evaluation circuit may include a cross-coupled pair of transistors. In addition, the sense amplifier may include an input circuit comprising an inverter.

The design processed by the design structure of the present invention may comprise a netlist which describes the circuit. The design may reside on a storage medium as a data format used for the exchange of layout data of integrated circuits. Furthermore, the design may include test data files, characterization data, verification data, and/or design specifications.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
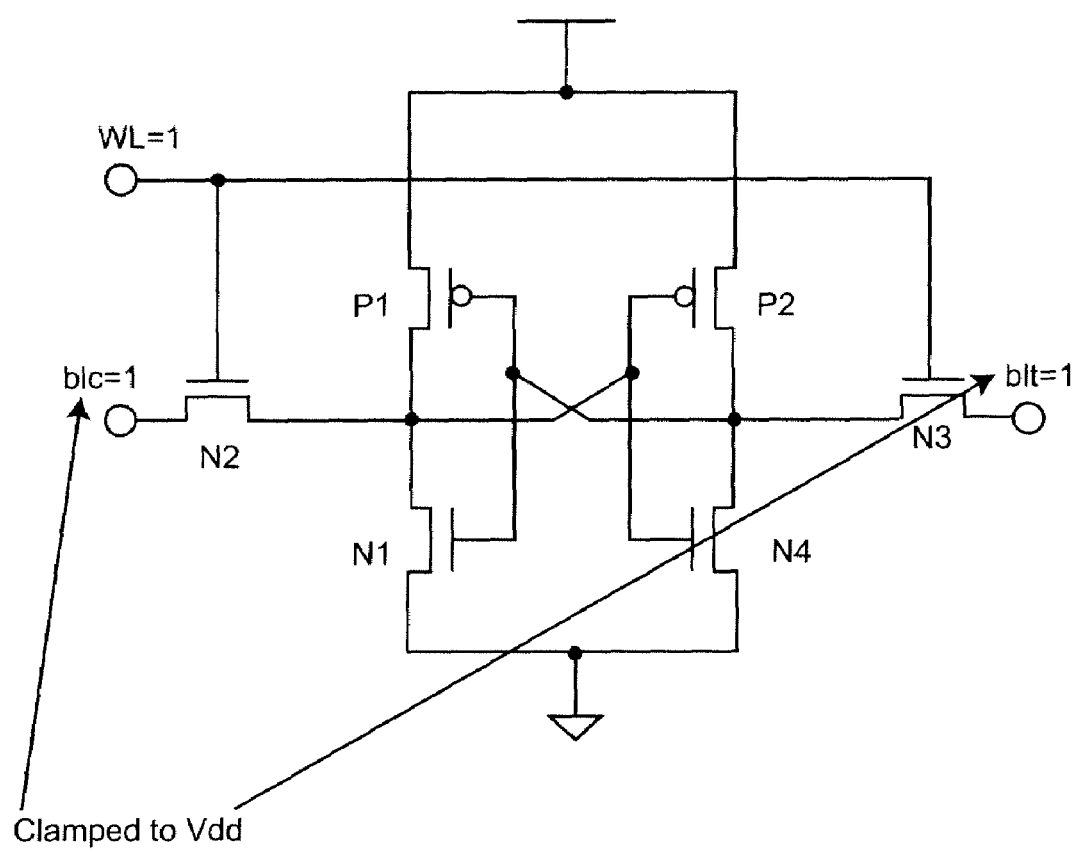
FIG. 1 is a schematic diagram of a 6-T memory cell useful for conveying an appreciation of the problem of memory cell instability.

Referring now to the drawings, and more particularly to FIG. 1, there is shown a schematic diagram of a 6-T static random access (SRAM) memory cell. While some circuitry therein and FIG. 1, does not necessarily include the invention, no portion of FIG. 1 is admitted to be prior art in regard to the present invention since the illustration of FIG. 1 is arranged to facilitate an understanding of the problem of memory cell instability associated with a half-select mode of operation alluded to above.

Figure 2:
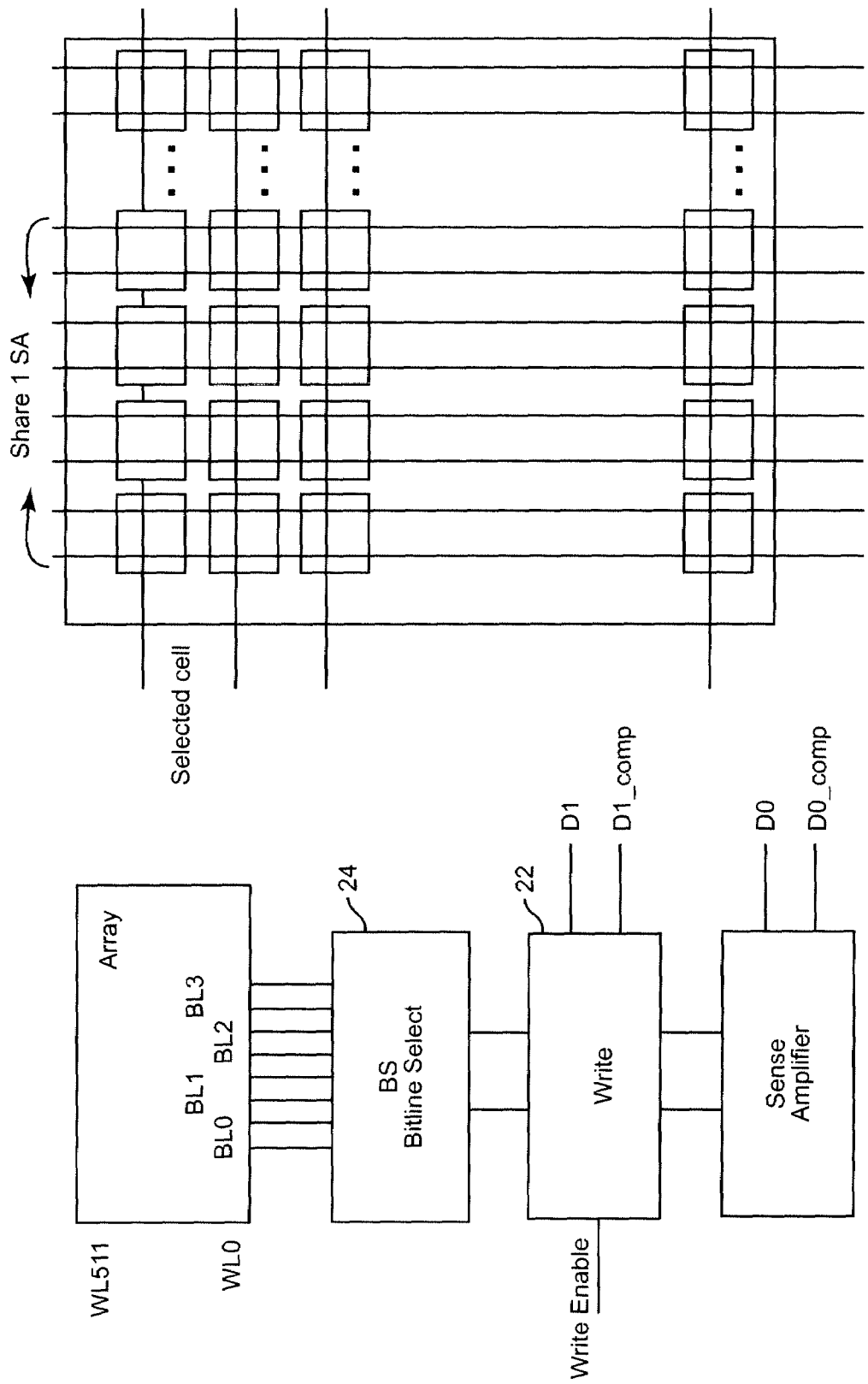
FIG. 2 illustrates an SRAM array architecture.
Figure 3:
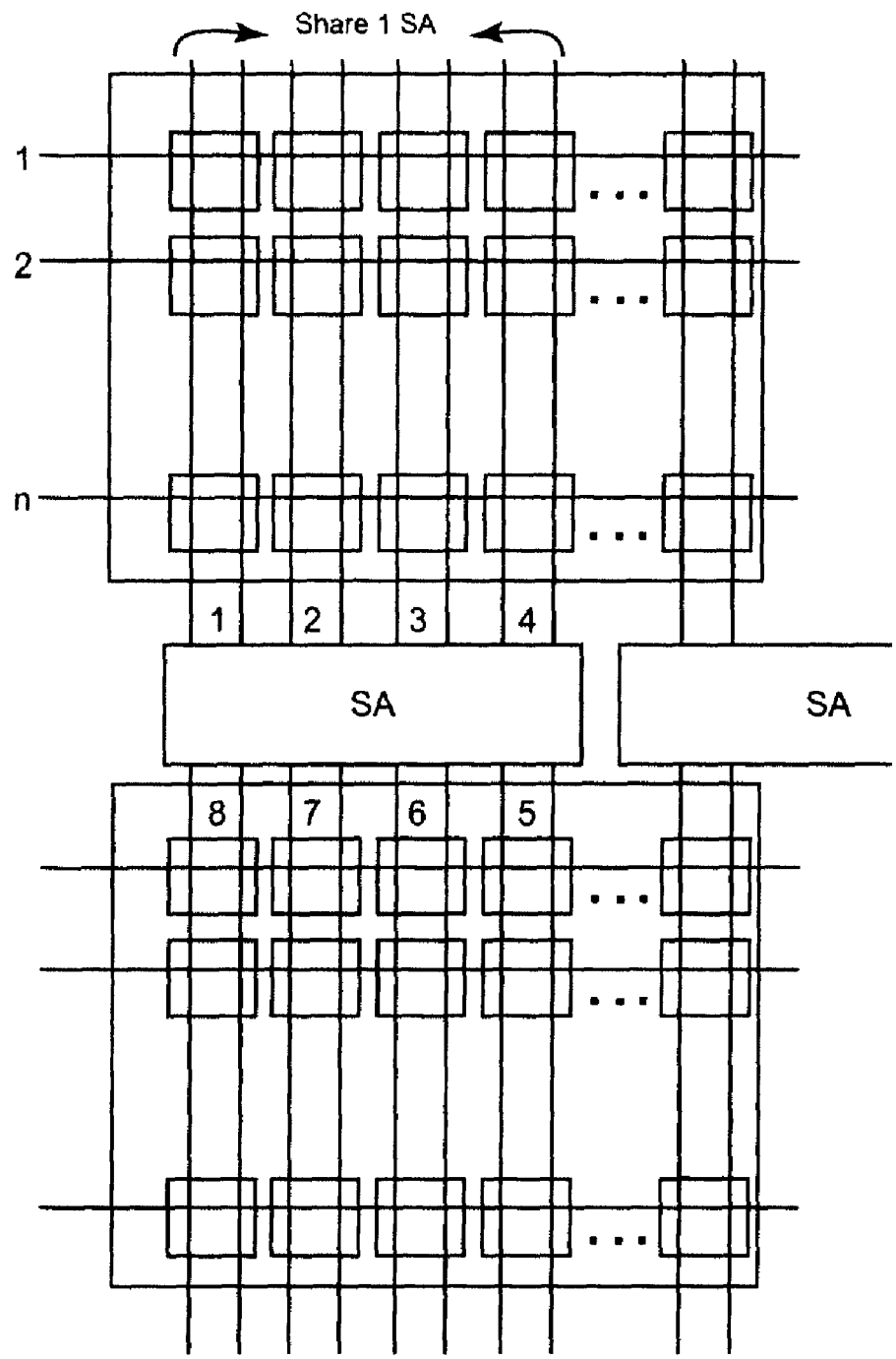
FIG. 3 illustrates inclusion of peripheral circuits in the array architecture of FIG. 2.

Specifically, in an SRAM array, individual memory cells are arranged in rows and columns (or the functional equivalent thereof) on a chip with the rows of cells sharing respective common word lines and the columns of cells sharing respective common bit lines, usually in bit line pairs for respective columns as shown in FIGS. 2 and 3. The bit lines for respective columns are connected to sense amplifiers SA as shown in FIG. 3, generally through a write control circuit 22 and a bit line select circuit 24 as shown in FIG. 2 and a plurality of bit lines or bit line pairs may share a single sense amplifier by use of bit line select circuit 24, as is commonly necessitated in current SRAM designs by a need to economically allocate chip space. To select a particular memory cell, a voltage is imposed on a word line WL (e.g. WL=1) to select a row of the array. The column containing the memory cell of interest is selectively connected to the sense amplifier by causing the sense amplifier inputs corresponding to bit lines of other cells to be clamped to a voltage (e.g. Vdd) or floated as depicted in FIG. 1 by blt=1 and blc=1; indicating, for example, similar voltages on the bit line true (blt) and bit line complement (blc) lines or terminals of the memory cell. This floating or clamping function as well as functional connection of the selected bit line or bit line pair is performed by bit line select circuit 24. Thus one cell of a row is selected while the remainder of the cells of the selected row are not fully selected but are referred to as being half-selected since transistors N2 and N3 of all memory cells connected to the selected word line WL are conductive when a WL=1 voltage is imposed on the word line.

Because transistors N2 and N3 of all memory cells of a selected row are conductive, any voltage on the sense amplifier inputs (or connections to the bit line select circuit 24) may be reflected into memory cells which are half-selected in a row of the array in which a memory cell is selected and can cause such half-selected memory cells to change state unpredictably, for example, if blt and blc are slightly unbalanced by noise across resistance of the bit lines or selection transistors while floated or clamped. It can be readily appreciated that the more memory cells which share a given sense amplifier, the greater the problem of memory cell instability will become. Additionally, the increased capacitance of longer bit lines to accommodate greater numbers of memory cells can also aggravate the instability problem (e.g. due to greater noise susceptibility) as well as increasing memory access time (due to increased resistance as well as capacitance) while memory capacity is of high importance.

It should also be appreciated that the size of transistors in the sense amplifiers cannot be significantly reduced consistent with their drive requirements and occupy a substantial fraction of the chip space, particularly as the size of transistors in the memory cell arrays is diminished because of the limitation on ability to drive the capacitance of bit lines; necessitating multiple arrays corresponding to the layout of FIG. 3 and requiring additional peripheral circuits (e.g. for separation, addressing and the like) to be fabricated on a chip. For example, a current SRAM design in 65 nm SOI technology has only 43% of the chip space allocated to memory cells. To date, the only known solution to the problem of instability of arrays of 6-T cells is to apply an offset Vdd to the array and peripheral circuits which only slightly relieves the instability problem but not the underlying half-select problem while compromising array performance or adding transistors to separate the row and column select. Since the latter alternative essentially requires adding two transistors to each cell (to essentially form an 8-T cell) the area penalty is significant.

To solve such problems and provide alternative, more feasible solutions without the associated penalties, the invention provides a three-dimensional (3-D) SRAM structure in which two or more active layers (e.g. chips) are stacked vertically, allowing at least sense amplifiers to be removed from the plane of the memory cell array. In one embodiment, virtually all peripheral circuitry including addressing decoders as well as sense amplifiers are removed from the plane of the memory cell array. Doing so decouples the allocation of memory cell area and allocation of sense amplifier/peripheral circuit area in memory device design and provides increased area for both which advantageously allows reduction of the number of bit lines or bit line pairs serviced by a given peripheral circuit, allowing substantial reduction of the problem of 6-T memory cell instability and, potentially, elimination of the underlying half-select mode of operation if a sense amplifier is allocated to each column of the array or bit line pair. Providing a greater number of sense amplifiers and/or addressing circuits also allows reduction of bit line length to further improve array performance.

Figure 4:
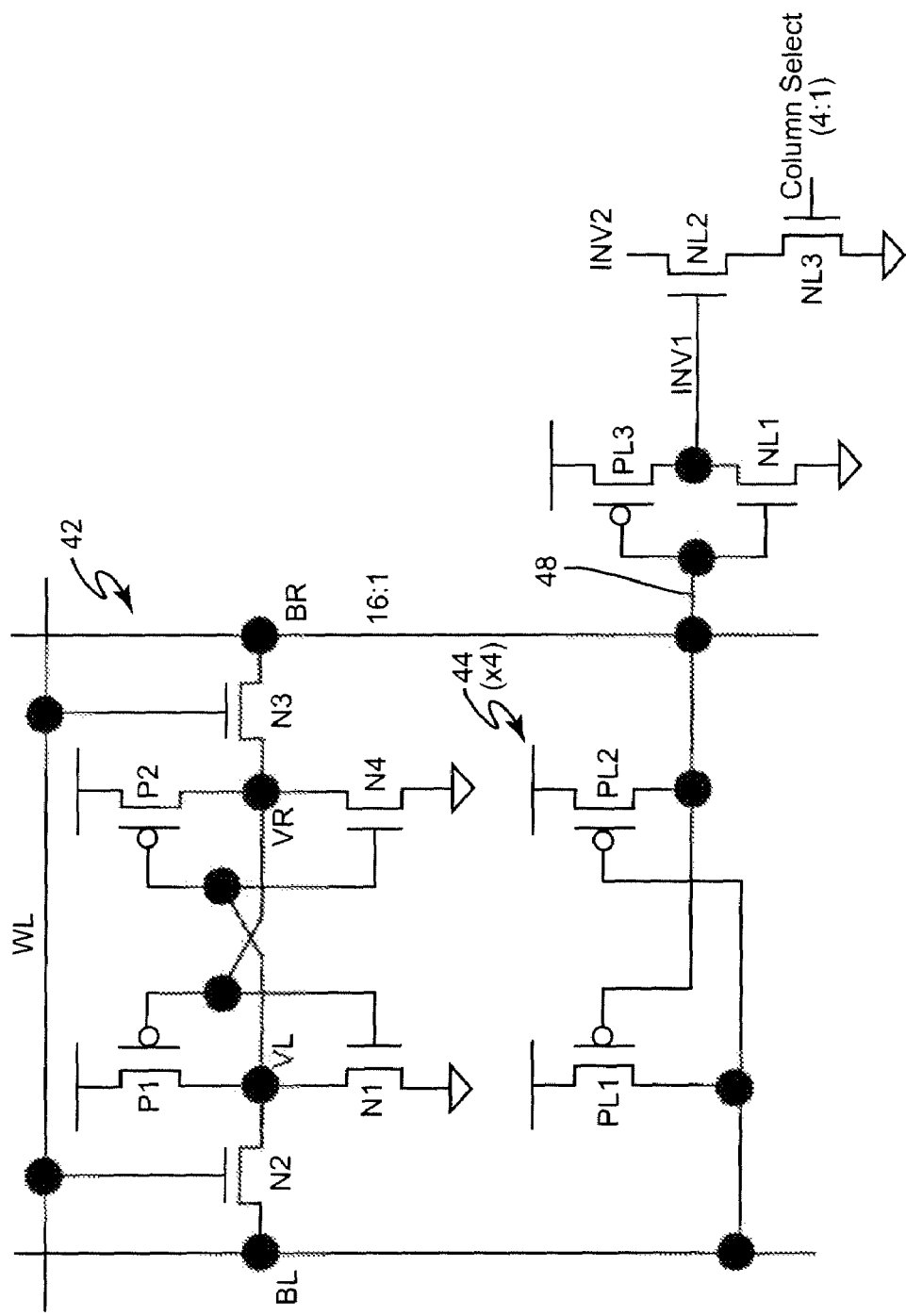
FIG. 4 illustrates inclusion of a so-called single port sense output circuit as a local bit line reader in a circuit including a 6-T memory cell and a sense amplifier.

Referring now to FIG. 4, a schematic of a memory cell 42 and sense amplifier 46 with the addition of a local bit line reader circuit 44, sometimes referred to hereinafter as a local evaluation circuit or, more generally, as a single port sense output circuit is illustrated. A bit line selection circuit BS (FIG. 1) between the bit lines and the local evaluation circuit 44 and/or between the local evaluation circuit 44 and sense amplifier 46 is omitted in FIG. 4 in the interest of clarity but is represented in the selection ratios indicated. Details of any such selection circuits are, in any case, unimportant to an understanding of the invention sufficient for its practice.

That is, it is preferred but not essential to the practice of the invention to articulate the array such that each sixteen rows of memory cells constitutes a block and row corresponds to sixteen columns. A local evaluation circuit 44 is provided for each four columns of each row. Thus four local evaluation circuits 44 are provided in each row such that each local evaluation circuit serves four memory cells in a sixteen cell row and selection is made between them using a 4:1 multiplexer (e.g. corresponding to select circuit 24 of FIG. 2 but not shown in FIG. 4) interposed in the circuit connection indicated at 48 of FIG. 4. An additional 4:1 selection is made at the input to transistor NL3 of sense amplifier circuit 46 as will be well-understood by those skilled in the art. By thus providing selection of a column within a selected row in two stages, the number of memory cells sharing a sense amplifier 46 or local evaluation circuit 44 is much reduced while a significant degree of isolation is provided between the sense amplifier and the memory cell by the local evaluation circuit. Further the sense amplifier circuit 46, by having a single input to the inverter formed by transistors PL# and NL1 is much less likely to be able to reflect a voltage back toward the memory cell.

The local evaluation circuit 44 comprises transistors PL1 and PL2 as shown in FIG. 4. The transistors are cross-coupled to function as a latch across the bit line pair BL and BR (either of which could correspond to blt and the other to blc of FIG. 1). This cross coupled pair of transistors will assume the same states as transistors P1 and P2 in the 6-T memory cell circuit 42 when transistors N2 and N3 are conductive and essentially function as a sense amplifier of much reduced size and complexity; only one such circuit being required for each bit line pair (and not for each cell) serving, preferably, sixteen memory cells along a column (to limit bit line length, resistance and capacitance), within which a row is selected by a word line. A large number of such local evaluation circuits 44 may be provided because transistors PL1 and PL2 need not be large since the only drive requirement is to drive the connection to the sense amplifier 46 comprised of, for example, transistors PL3, NL1, NL2 and NL3 over a single line connection 48.

Therefore, minimal space is required for transistors PL1 and PL2 while substantial isolation of the 6-T memory cell from voltages in the sense amplifier 46 is provided. Further, as will be appreciated from the following discussion, a given sense amplifier 46 can be shared by a reduced number of local evaluation circuits 44 (a 4:1 sharing being illustrated in FIG. 4) and, in turn, a reduced number of memory cells share a local evaluation circuit and/or sense amplifier, further reducing the 6-T memory cell half-select instability problem. Those skilled in the art will also recognize that sense amplifier circuit 46, receiving input over only connection 48 can be much simplified, particularly in connection with provision of selection or deselection at transistor NL3, in comparison with prior art sense amplifiers (which sense imbalance of the voltage between bit lines of the bit line pairs) and that no particular voltages or constraints thereon are required at the sense amplifier input (e.g. connection 48) while the state of the 6-T memory cell is replicated in the local evaluation circuit 44 upon transistors N2 and N3 becoming conductive. Thus, while the half-select mode of operation remains as long as sense amplifiers are shared by plurality of bit lines, the problem of memory cell instability is substantially eliminated as long as the noise and capacitive coupling to bit lines BR and BL can be overcome by the drive capabilities of PL1 and PL2, even though that drive capability is much smaller than that of sense amplifier 46.

Figure 5:
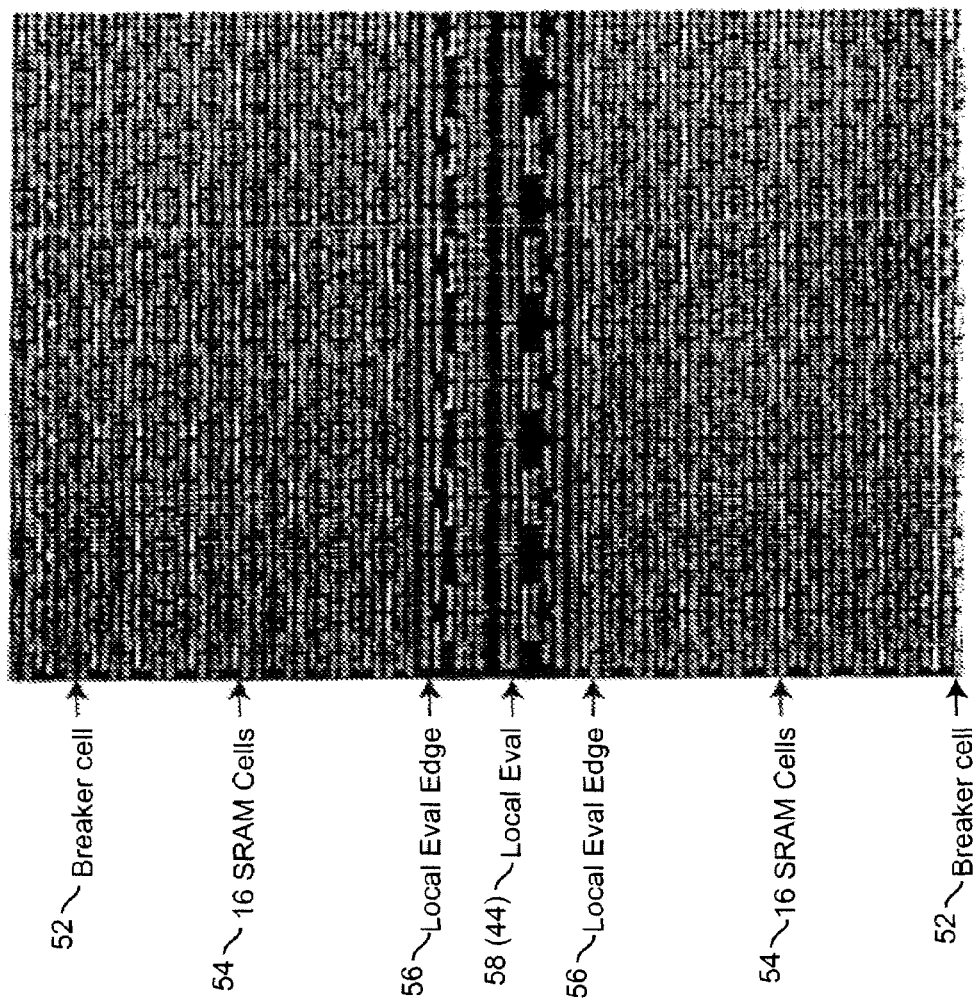
FIG. 5 shows a chip layout of an array segment including the local bit line reader circuit of FIG. 4.

Referring now to FIG. 5, a layout of a section of a memory array in accordance with the invention is shown in plan view. This section of the memory cell array may be replicated many times over a memory chip and corresponds to a single or small plurality of sense amplifiers (which may be increased in comparison with known designs by virtue of the use of the invention to place them in a separate plane). So-called breaker cells 52 are formed at the top and bottom edges of the section to separate the section from other sections which may be formed on the chip adjacent to the section illustrated. Next to the breaker cells 52 toward the center of the array section are respective arrays of SRAM cells which is, for example, sixteen 6-T memory cells wide and of a number of rows corresponding to a practical bit line length, in this exemplary case preferably sixteen rows of 6-T memory cells 42. These memory cell arrays are bounded by the edge 56 of the local evaluation circuits 58 (corresponding to the edge of the area in which circuits 44 in FIG. 4 may be located) and also forms an interface to the support/peripheral circuits in accordance with the principles of the invention. As alluded to above, the architecture and layout of this memory array section is similar to known arrays but for the substitution of local evaluation circuits 58 (44) for sense amplifiers which form the boundary of the support or peripheral circuits of the SRAM. Accordingly, no portion of FIG. 5 is admitted to be prior art in regard to the present invention.

Figure 6:
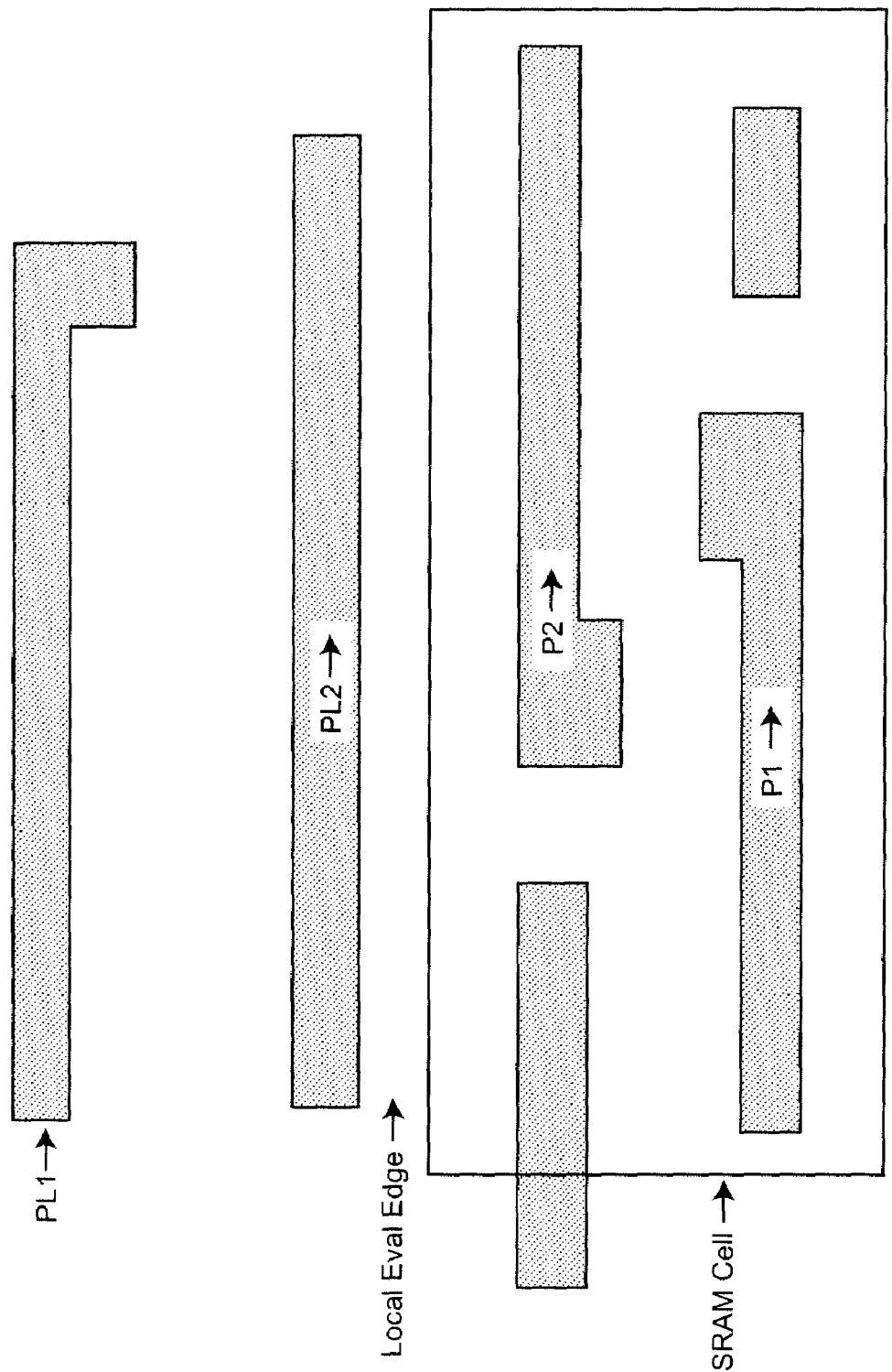
FIG. 6 shows a detail of the chip layout of FIG. 5.

FIG. 6, shows an enlarged portion of the layout and chip architecture illustrated in FIG. 5 at a location corresponding to the local evaluation circuit edge 56 and, at the top portion of FIG. 6, extending slightly into the local evaluation circuit 58 and, at the bottom, extending slightly into an SRAM cell immediately adjacent the edge 56 of the local evaluation edge. Exemplary structures forming gates of transistors P1, P2, PL1 and PL2 as shown in FIG. 4 are indicated therein. While such a layout detail may be applicable to other chip architectures or other devices, no portion of FIG. 6 is admitted to be prior art in regard to the present invention but, rather, is provided to facilitate an understanding of FIG. 7 which is preferred for practice of some embodiments the invention.

Figure 7:
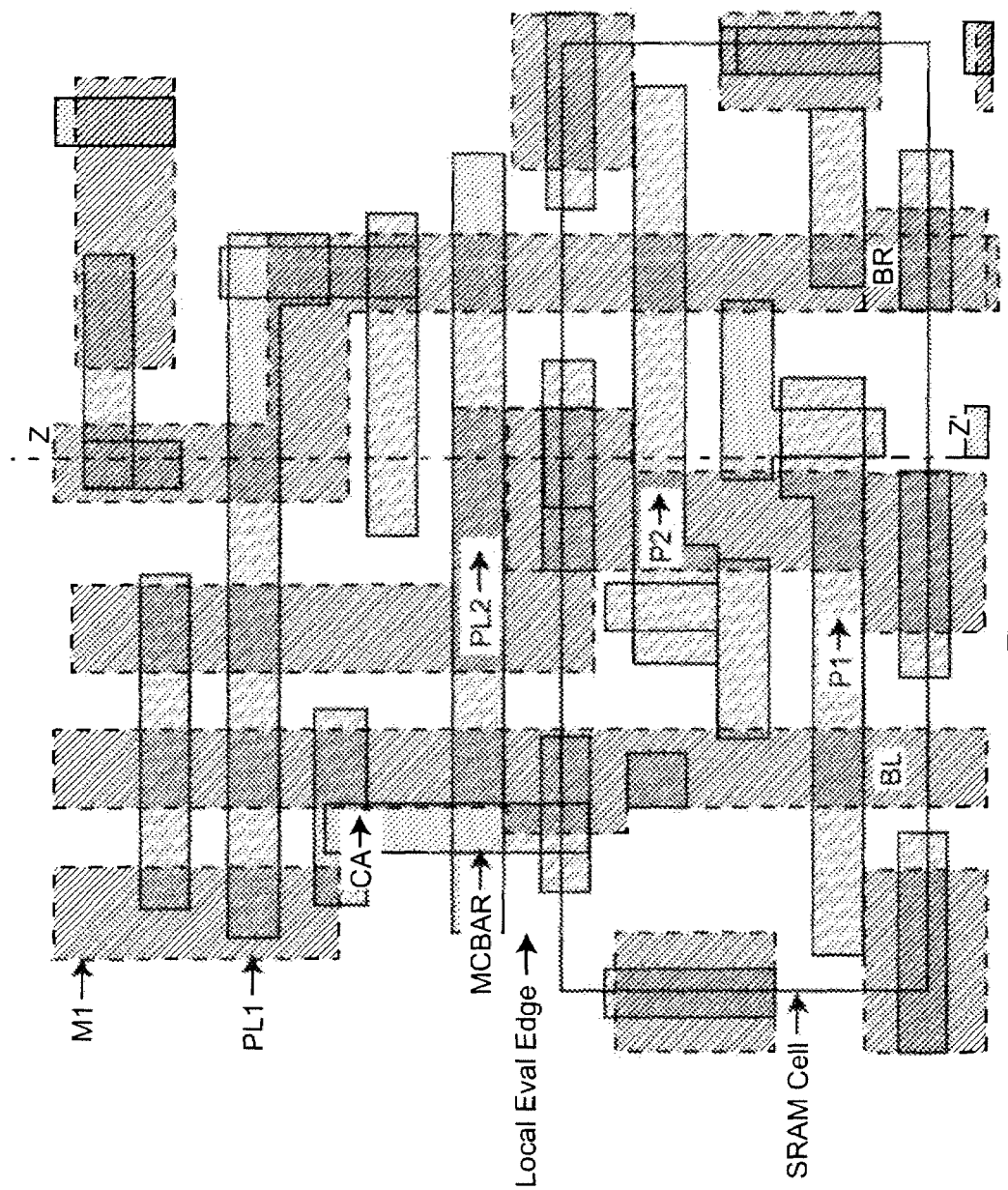
FIG. 7 shows a detail of a chip layout including an additional local contact structure in accordance with the invention.

FIG. 7 largely corresponds to the layout of FIG. 6 except that additional connection layers (CA) employed in the transistors and the bit line pair BR, BL are also illustrated. FIG. 7 also illustrates inclusion of a layer in addition to the first metal layer M1 forming a local contact designated MCBAR which can conveniently (because of polysilicon PC and active silicon RX layers) serve as a type of contact via in much the same manner as the CA or V1 layers. Contact structure MCBAR is preferred for implementation of the 3-D structure in accordance with the invention and basically corresponds to connection 48 of FIG. 4 but is not otherwise important to practice of the invention in accordance with its basic principles.

Figure 8:
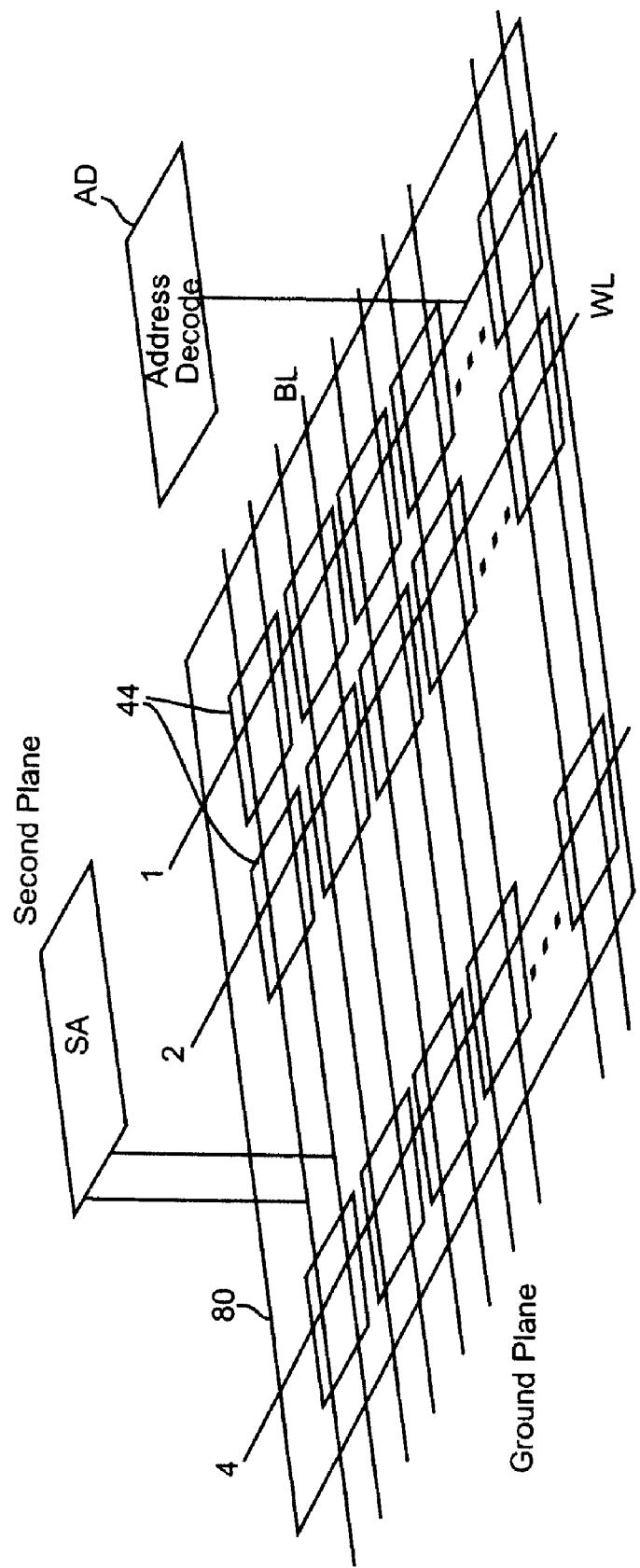
FIG. 8 illustrates the basic concept of the 3-D SRAM array architecture in accordance with the invention, FIG. 9 schematically illustrates a cross-section taken at section Z-Z' of FIG. 7.

The basic concept of the 3-D structure in accordance with the invention is illustrated in FIG. 8. In FIG. 8, memory cells (in a rectangular matrix array for clarity of illustration, similar to that of FIGS. 2 and 3) are illustrated in an isometric view with word lines running from upper left to lower right and bit line pairs running from upper right to lower left in registration with the memory cells. The array of memory cells is depicted as being formed on (or in) ground plane 80 which is or is parallel to a substrate or chip surface. Peripheral or support circuits such as sense amplifiers (e.g. SA) and/or address decoders (e.g. AD) are formed in at least a second plane different from that defined by the chip or substrate carrying the memory cells 44. In general, a single second plane will be sufficient to carry an adequate number of peripheral or support circuits to realize the meritorious effects of the invention, as will be discussed in greater detail below, although a third, fourth of more further additional planes could be added if desired.

It is very important to a full appreciation of the invention that in a configuration such as that depicted in FIG. 8, sense amplifier connections to bit lines or bit line pairs or connections thereto (e.g. 48 through local evaluation circuits 44) may be made at any point along the length of the bit lines in a second plane and need not be confined to the central portion of the array, as is generally a feature of single plane memory layouts as alluded to above. By the same token, address decoders and/or word line drivers may be placed at any location in a second plane along the entire length of any particular word line. The importance of this feature of the invention in addition to allowing more area of a second or further plane to be used for support circuits is that it also facilitates using a greater fraction of chip area in a second or further plane as well as making connections from any location in the second or further plane to the ground plane circuits without causing significant increase in connection length. Several preferred ways of exploiting this feature of the invention will be discussed in greater detail below. Further, since support/peripheral circuits (and selectors for allowing sharing between them and the bit lines) can thus be freely located in or on the second or further plane, there is no restriction due to required position or connection length on the number of support or peripheral circuits which may be formed, and, ideally, the sense amplifiers and/or local evaluation circuits may be sufficiently increased in number that sharing of sense amplifiers for a plurality of bit lines or bit line pairs is significantly reduced or eliminated along with the potential for elimination of the half-select mode in a manner which is much more simple than is possible when sense amplifiers are shared. Even if sense amplifiers must be shared, the number of bit lines serviced by each sense amplifier can be reduced to reduce the effects of sharing on potential cell instability and which is further reduced by the provision of local evaluation circuits. By the same token, the SRAM array density can be maintained or improved without sacrificing or compromise of functionality and performance while more chip area for a chip of given size can be used for the memory cell array. Thus, several possible embodiments of the invention are possible such as forming the local evaluation circuits 44 in the same plane with the memory cells and sense amplifiers 46 removed to a second plane, forming both the local evaluation circuits in a second plane (making essentially the full area of the ground plane chip available for memory cells) or populating the second plane principally or fully with local evaluation circuits 44 (which are, in any case, a form of sense amplifiers) and forming sense amplifiers 46 or at least a portion of them on yet another plane or chip.

It should also be noted in connection with FIG. 8 that the length of connections between the planes is not significantly increased since the connections between planes can be made at essentially arbitrary locations and, if the respective support circuits are positioned above the word lines or bit lines to which they correspond (which is easily accomplished since the individual sense amplifiers and word line drivers are fungible and the word line decoder can be designed to have suitably distributed outputs), the connection length can be held to the sum of the respective thicknesses of the semiconductor devices and their in-plane connections, the thickness of passivation layers on the respective substrates and the thickness of the bond between the substrates. This sum of thicknesses may be held to approximately the thickness of the active layer of an SOI substrate by a number of techniques well-understood in the art and as will be detailed below.

Figure 9:
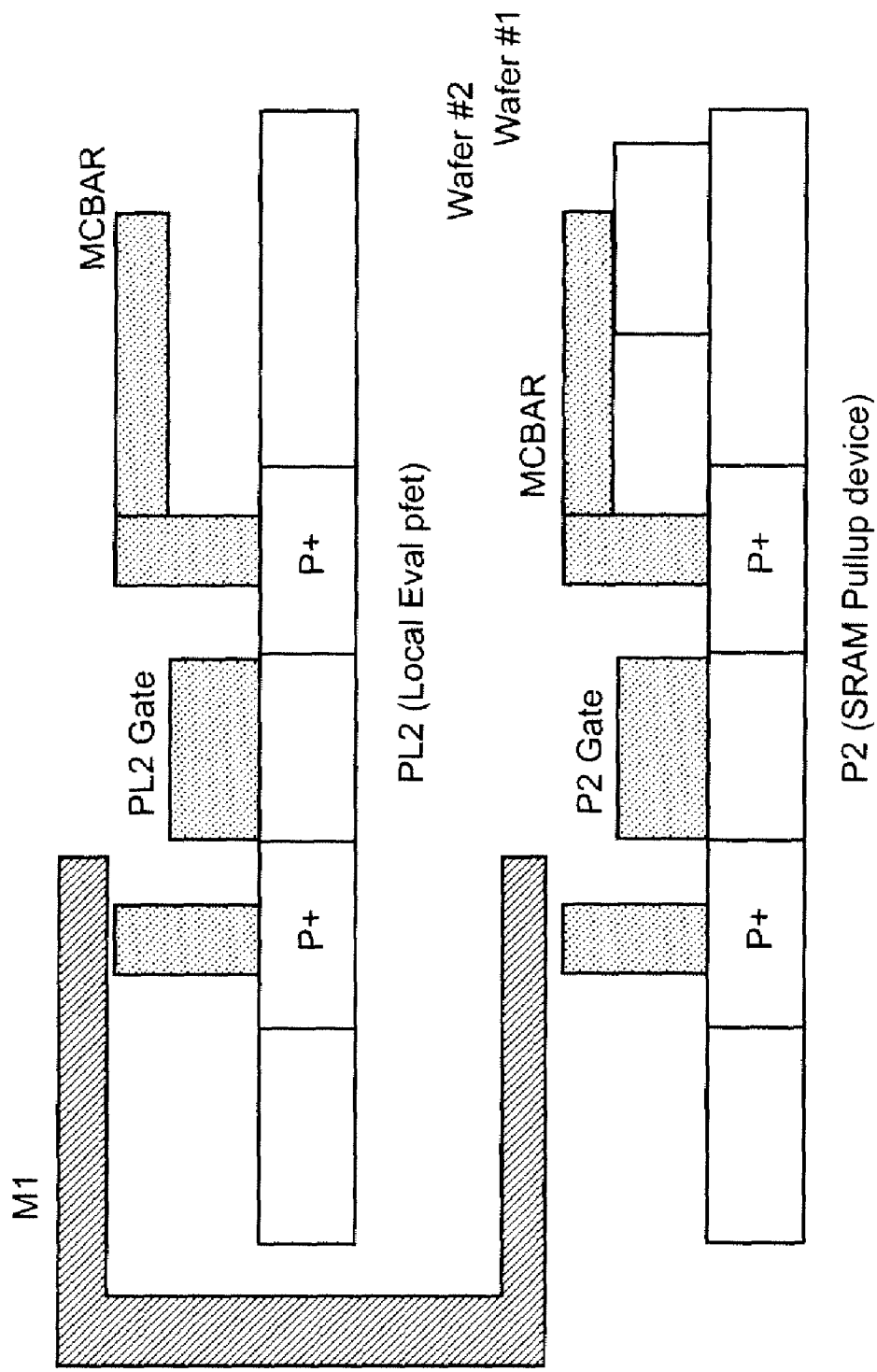

FIG. 9 is a cross-section taken at section Z-Z' of the memory stricture illustrated in plan view in FIG. 7. Local connection in the memory cells can be made using CA and MCBAR structures discussed above which are well-understood in the art. These connections include PC to RX connections, RX to metal layer connections PC to metal layer connections and the like. The interconnections between the respective memory cells and local evaluation circuits/sense amplifiers can be made using the first metal layer (M1) between the two planes. This 3-D memory device architecture thus allows any desired portion of the support/peripheral circuits to be placed in a second or further planes, such as placing the local evaluation circuits 44 (which function as a type of sense amplifier as well as providing isolation) in a second plane with reduction of the number of memory cells shared by each local evaluation circuit and with simplified sense amplifiers 46 in increased numbers in either the second plane or a third plane with selection circuits between the local evaluation circuits 44 and sense amplifiers 46 in either the second or third plane.

Figure 10:
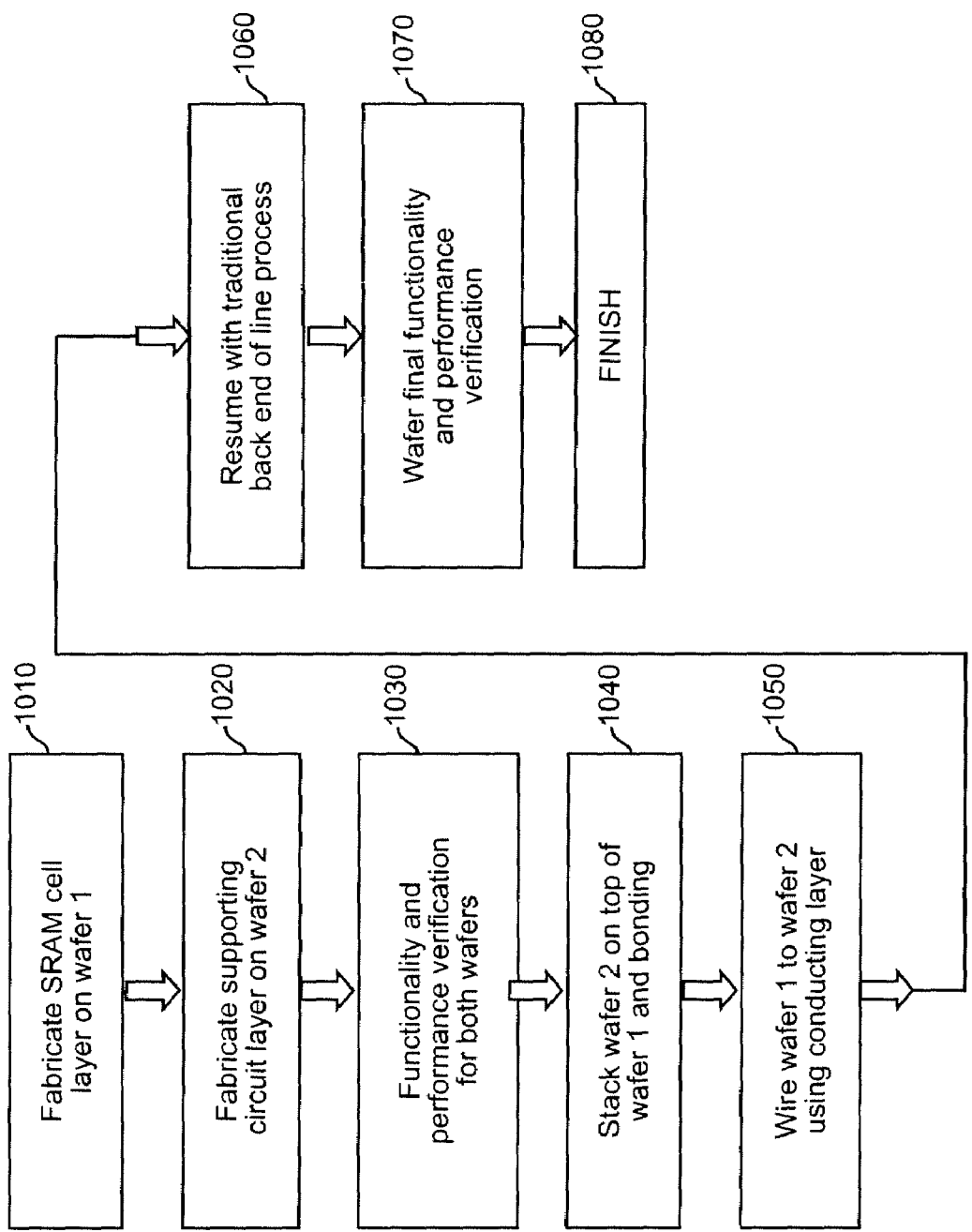
FIG. 10 is a flow chart illustrating a manufacturing process for making the invention.

Placing the memory cells and at least a portion of the support or peripheral circuits in different planes also has meritorious effects during manufacture by allowing the memory structures and peripheral/support circuit structures (which usually involve transistors of very different designs and sizes) to be manufactured separately with fully decoupled process sequences applied to different wafers as shown as 1010 and 1020 of FIG. 10; a preferred process sequence for which will be detailed below in connection with FIGS. 14-18. Perhaps more importantly, however, such separate fabrication allows separate test and functionality verification of the memory cells and peripheral/support circuits before the planes are bonded together (which thereafter restricts testing probe access and/or access for any repairs or engineering changes which can enhance manufacturing yield) or wired together (which thereafter complicates interpretation of test results and fault location) as shown at steps 1030, 1040 and 1050 of FIG. 10. These steps allow much enhanced manufacturing yield and confidence level in the operability and quality of the completed SRAM. After such testing and associated processes, the bonded integrated circuit planes may be completed by resuming standard back end of line (BEOL) processes as shown at 1060, 1070 and 1080 of FIG. 10.

Figure 11:
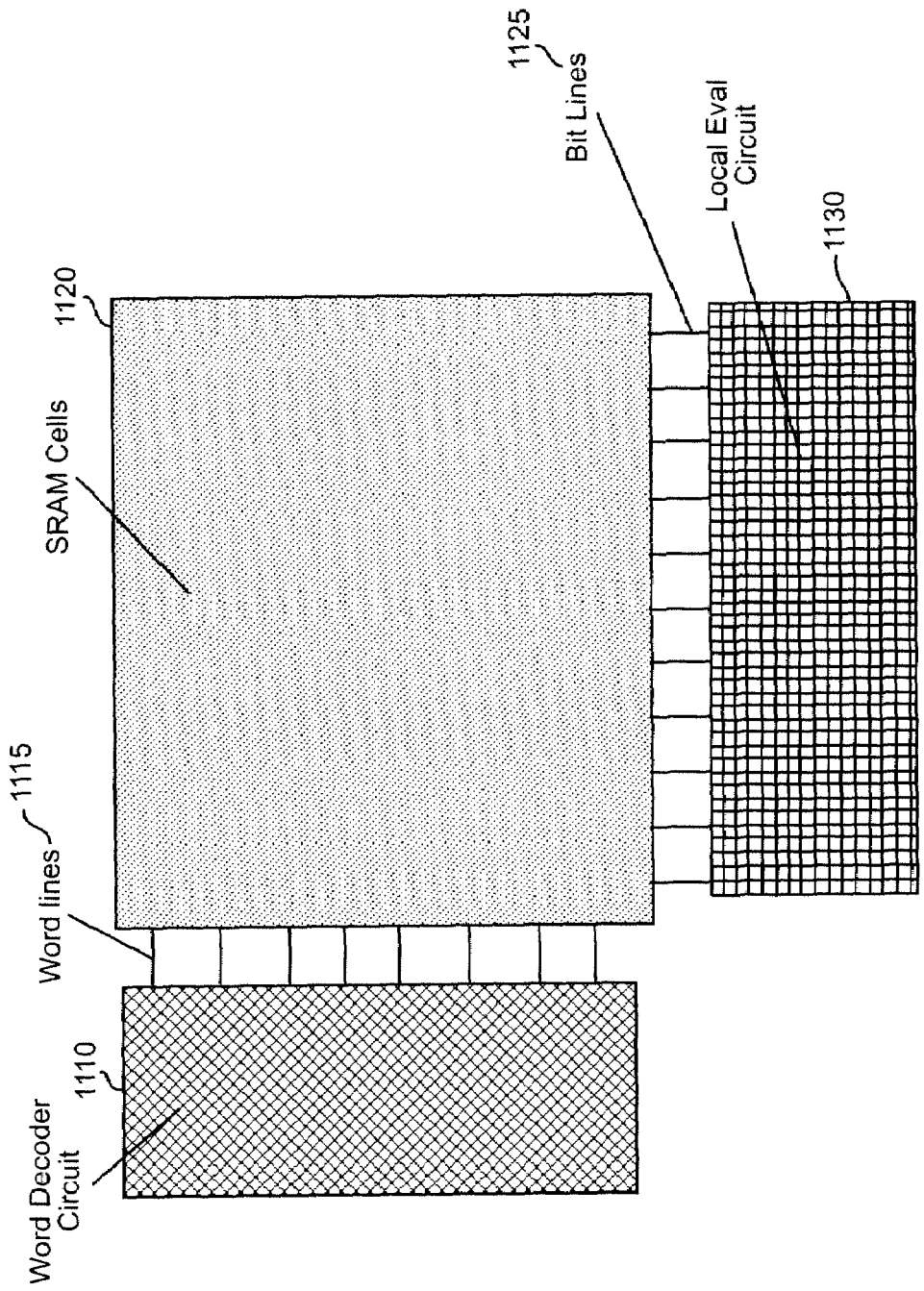
FIGS. 11, 12, 13, 14, 15, 16, 17 and 18 are cross-sectional views of details of a preferred method of fabricating a 3-D SRAM in accordance with the invention.

Referring now to FIG. 11, a layout for a SRAM formed in a single plane is schematically illustrated in plan view. Since this depiction includes local evaluation circuits rather than sense amplifiers at 1130, no portion of FIG. 11 is admitted to be prior art in regard to the invention. In order to select a row in which a memory cell of interest is included, a word decoder circuit 1110 (generally including a word line driver circuit) is provided to apply a selection voltage to one of the word lines 1115 connected to the memory cell array 1120 the application of a selection voltage to a word line connects a row of memory cells to bit line 1125 pairs respectively corresponding to the individual memory cells in the selected row as discussed above in connection with FIG. 1 and thus to the local evaluation circuits 1130 as discussed above in connection with FIG. 4. It can be appreciated that such a configuration severely limits the area which can be allocated to memory cells and, while word line and bit line lengths are substantially minimized, the length and capacitance thereof is significant.

The invention is preferably implemented in accordance with one of a number of possible embodiments which will now be discussed; from which others will be evident to those skilled in the art. These embodiments differ from each other principally by the particular peripheral/support circuits 1110 and/or 1130 which are placed in a second or further plane in accordance with the invention.

Figure 12:
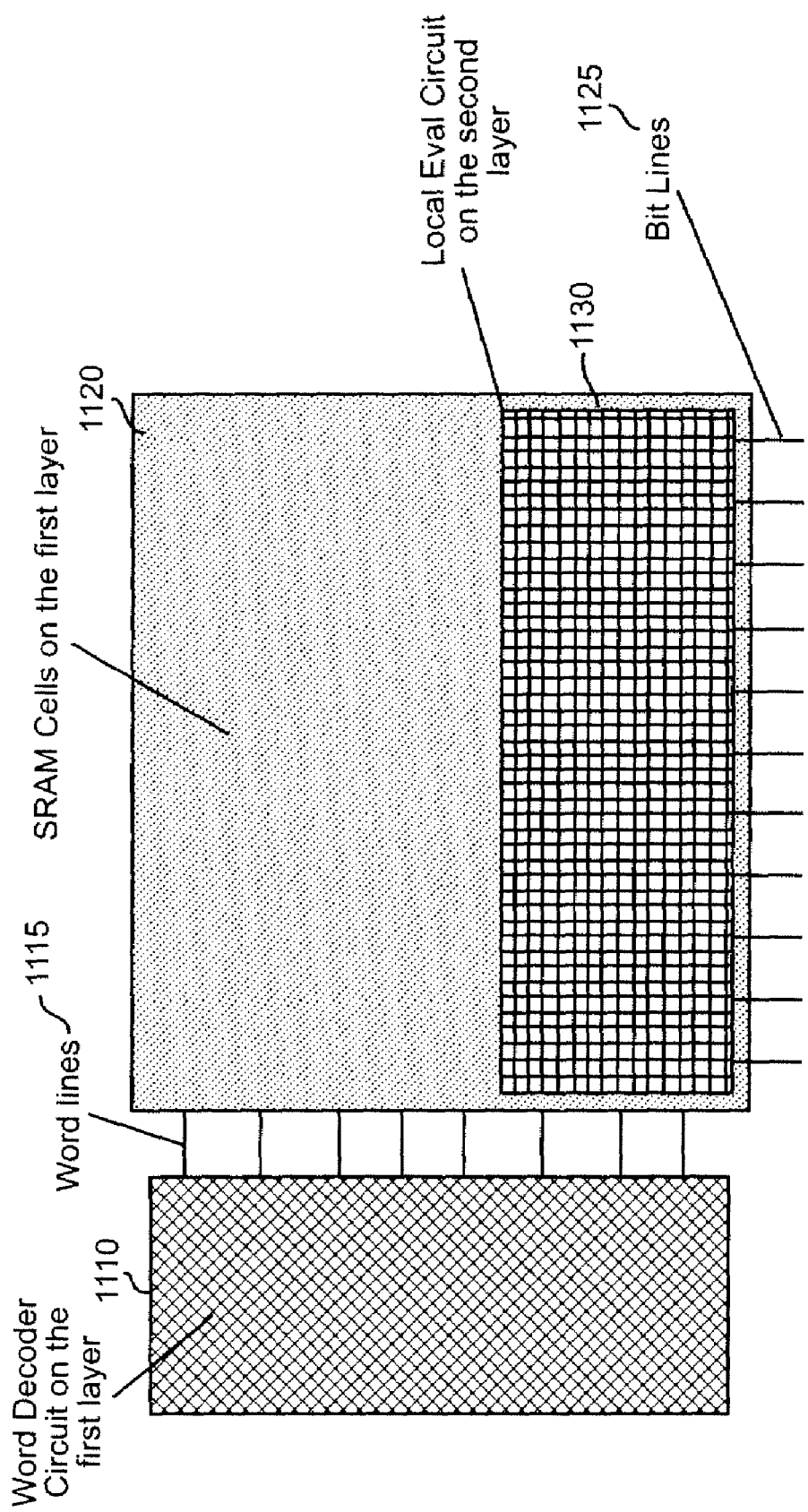

A first embodiment of the invention is illustrated in FIG. 12. In this embodiment, the local evaluation circuits are placed in the second or further plane. The sense amplifiers may be included with the local evaluation circuits or placed in yet another plane. Such a configuration can be achieved by simply making connections at the chip or plane edges and, in effect, folding the bit line connections and the local evaluation circuits over the SRAM cell array. On the other hand, as alluded to above, connections from the memory cell array to the local evaluation circuits 44 may be made at any point within the area where the local evaluation circuit plane overlies the SRAM cell array and bit lines therein. Alternatively, either or both of these constructions could be applied to the word line decoder 1110 instead of the local evaluation circuits and the area available for either could equal or possibly exceed the area of the chip array although, in the latter case, some complications of connections of the support circuitry and the memory array may be presented. As a further alternative, the word line decoder could be placed on a separate plane on one side of the memory cell array chip and the local evaluation circuits and/or sense amplifiers could be placed on a separate chip on the opposite side of the memory cell array chip.

Figure 13:
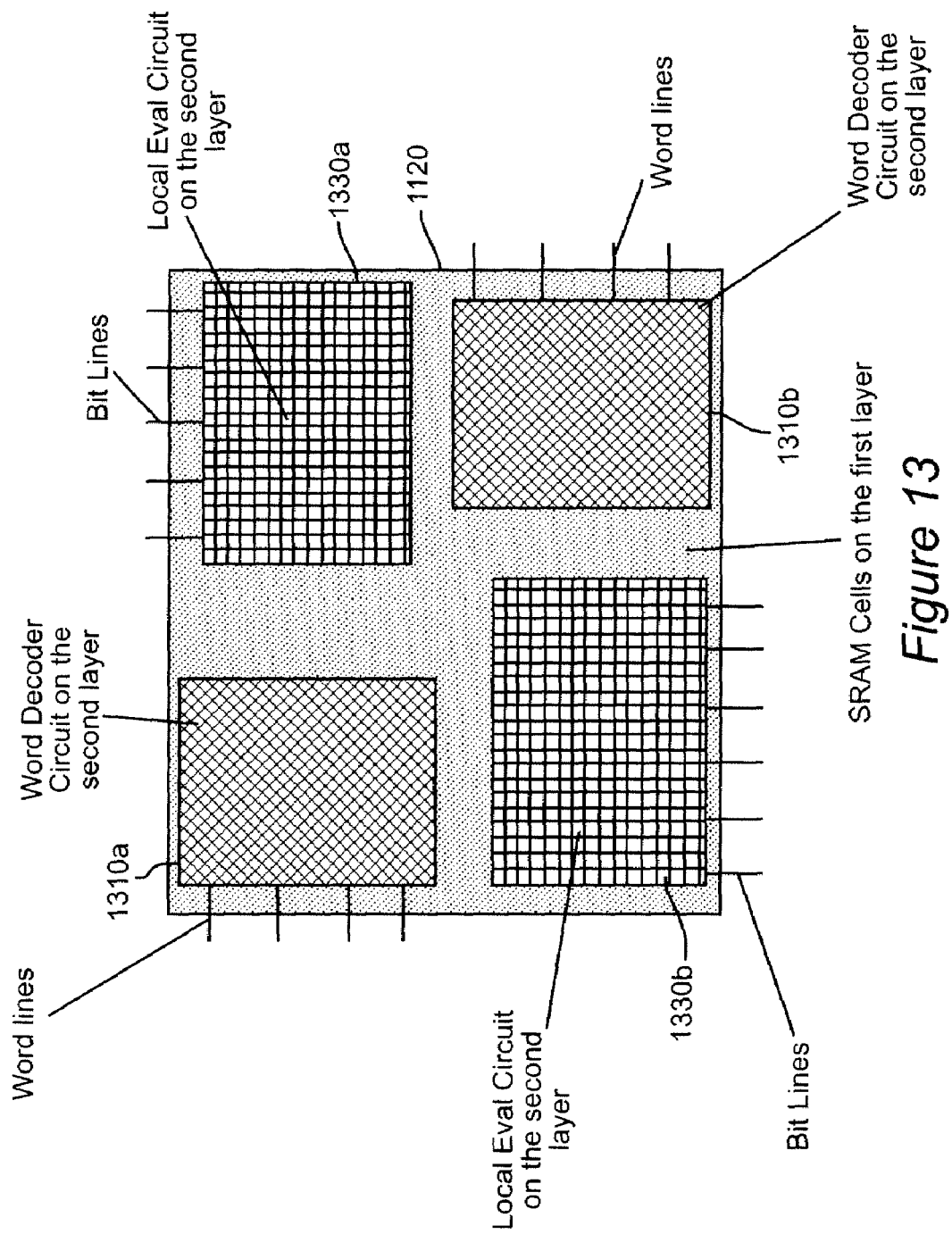

A second embodiment of the invention is illustrated in FIG. 13. In this case, both the sense amplifiers (possibly including the local evaluation circuits) and the word line decoders/drivers are placed in the second or further plane. As pointed out in connection with FIG. 8, in accordance with the invention, the word line decoders/drivers and the sense amplifiers/local evaluation circuits may be connected to the word lines and the bit lines/bit line pairs, respectively, may be placed at any point along the lengths of the respective word lines and bit lines without significantly increasing connection length and capacitance.

If the technique of simply "folding over" the respective support/peripheral circuits on the same side of the memory array chip which characterizes the first embodiment of the invention shown in FIG. 12 and described above, is applied to both the sense amplifier/local evaluation circuit array and word line decoder/driver circuitry, although possible, minimal connection length to the memory array could not me maintained since the circuits 1110, 1130 would overlap. Moreover, connections would be further complicated by having to make connections from the memory array to one of the sense amplifier array or the word line decoder/driver circuitry through the other which consumes space and greatly increases overlay error criticality. However, such difficulties may be avoided by (physically or lithographically) dividing circuits 1110 and 1130 into two or more respective portions such as 1310a, 1310b and 1330a, 1330b which may then be tiled onto the memory array 1120, as desired, one possible configuration of which is illustrated in FIG. 13, and directly bonded thereto. Thus, minimal length of connections between both of the peripheral/support circuits and the word lines and bit lines of the memory array can be maintained.

An exemplary integrated process flow for fabrication of devices in accordance with the invention will now be explained with reference to the cross-sectional views of FIGS. 14-18. This exemplary process flow eliminates the MCBAR structure discussed above because MCBAR can be replaced by CA in most cases. Nevertheless an MCBAR structure may be used if convenient in particular applications to facilitate placement of either or both of the peripheral circuits, as will be apparent to those skilled in the art. The invention, in accordance with its basic principles, does not require any change in the structure or layout of the individual 6-T memory cells and the invention may be applied to most, if not all, arrays thereof, regardless of individual memory cell layout which, by the same token, is not at all critical to the successful practice of the invention. Any modification thereof necessary to implement the invention using any known 6-T memory cell layout will be limited to the formation of contacts that accommodate the bonding of a second or further plane to the memory cell array 1120.

Figure 14:
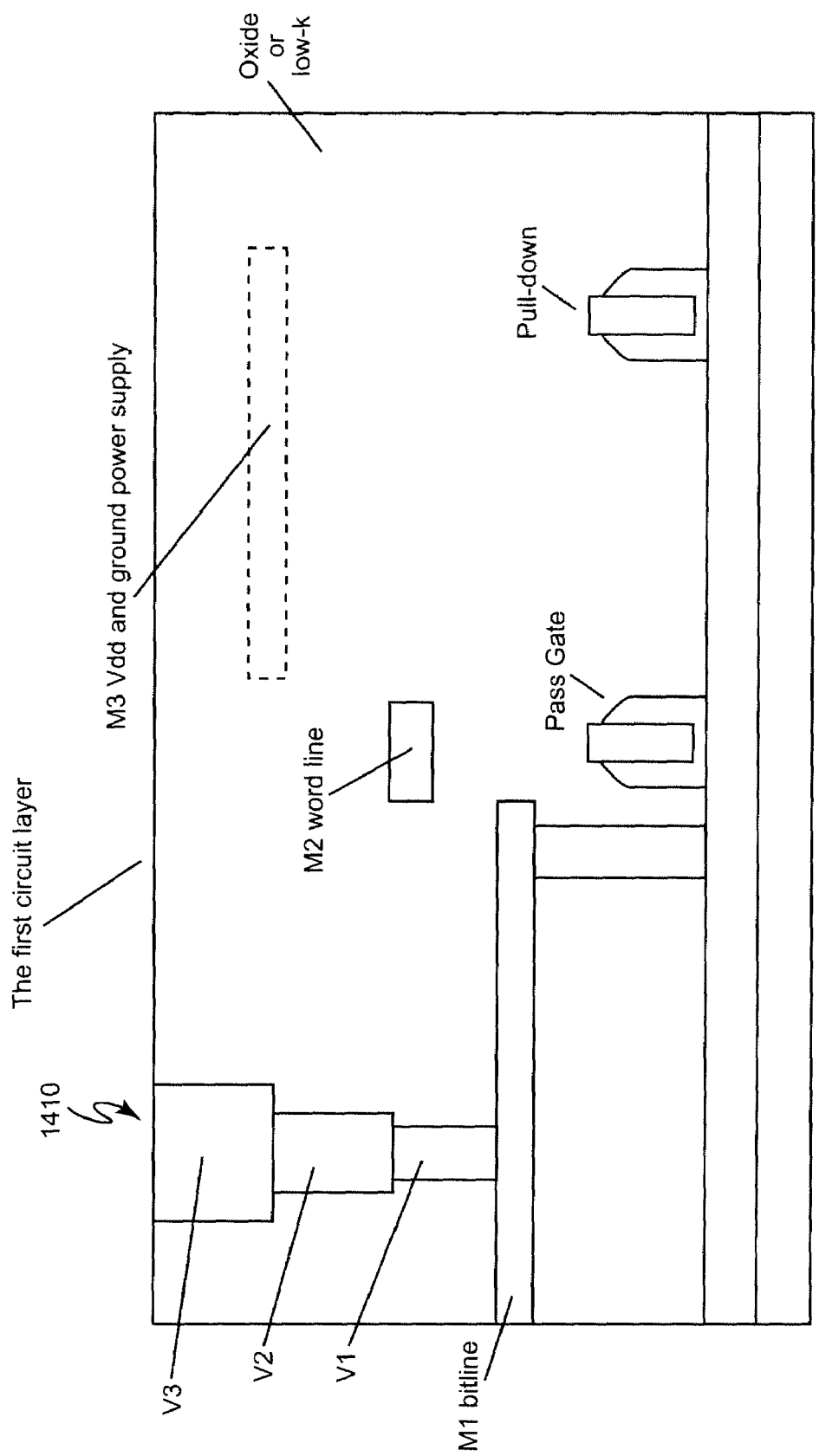

FIG. 14 thus illustrates an integrated circuit having a completed array of SRAM cells which has several metal layers for connections within the respective memory cells and bit line (M1), word line (M2) and power (M3) connections thereto as are customary in most designs using silicon-on-insulator (SOI) technology. Using bulk or so-called M2 bit line design semiconductor technology, the word line and Vdd connections are usually fabricated at the M3 level and an additional M4 level is used for the ground connection. Exemplary pass gate and pull-down transistor structures (e.g. N2 and N1 of FIG. 4) are also illustrated. It should be noted that a via structure 1410 is preferably provided in multiple levels V1, V2 and V3 to provide a stepped structure in order to minimize overlay error criticality in making bit line connections. A similar structure may be provided for the word line in implementations of the second embodiment of the invention.

Figure 15:
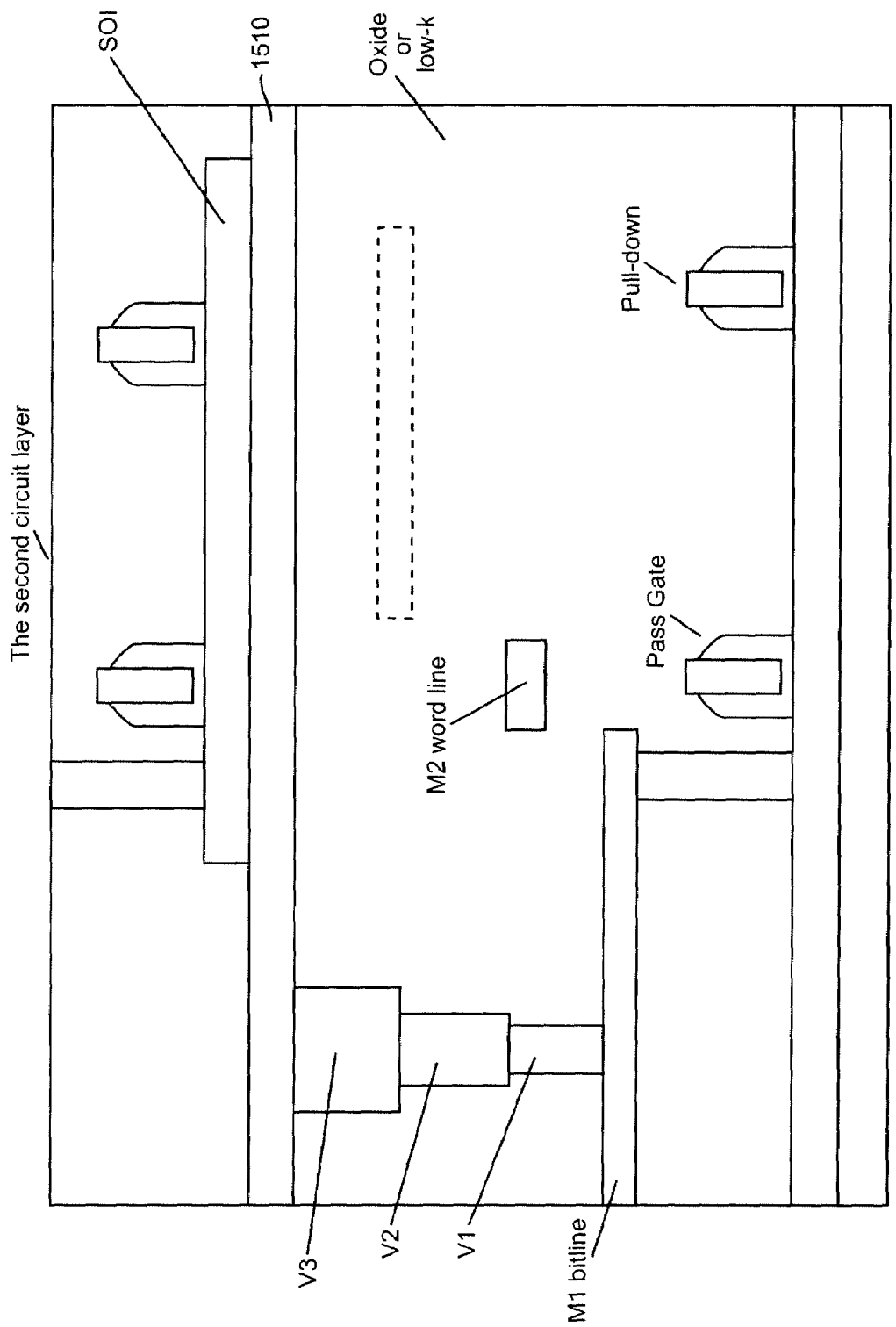

It should also be noted for a proper understanding of the following discussion, that the support circuits, at least to the extent of local evaluation circuits, has a structure in which the transistors PL1 and PL2 (FIG. 4) substantially corresponds to the structure of the pull-down and pass gate transistor structures of FIG. 14 and which is separately fabricated on the same or, preferably, a second plane, in a manner well-understood in the art and not critical to the practice of the invention but, if formed in the same plane, is preferably implemented using SOI technology to minimize substrate thickness as shown in FIG. 15 which illustrates bonding of the support circuit plane substrate to the memory cell array plane substrate by bonding layer 1510.

Figure 16:
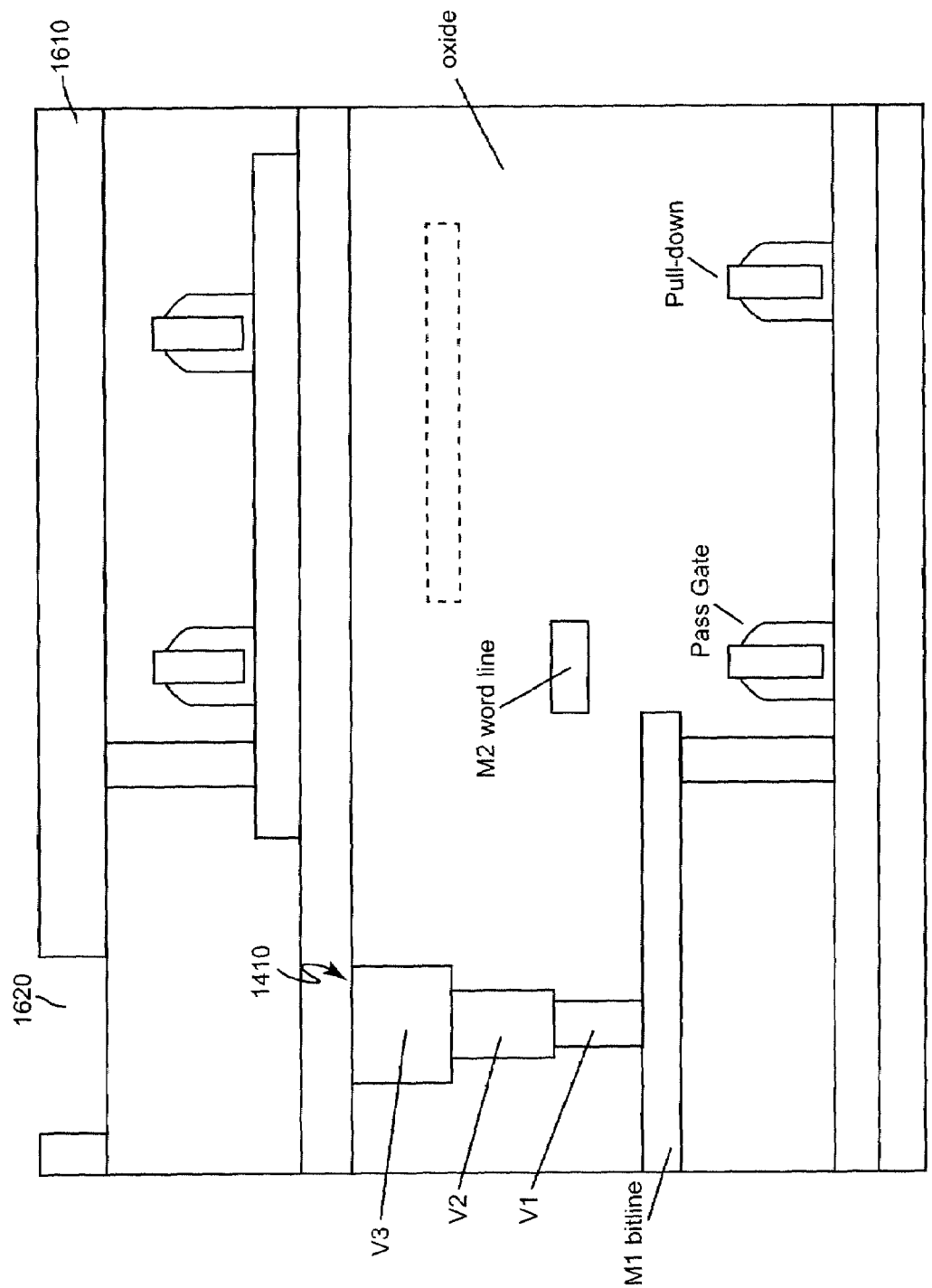
Figure 17:
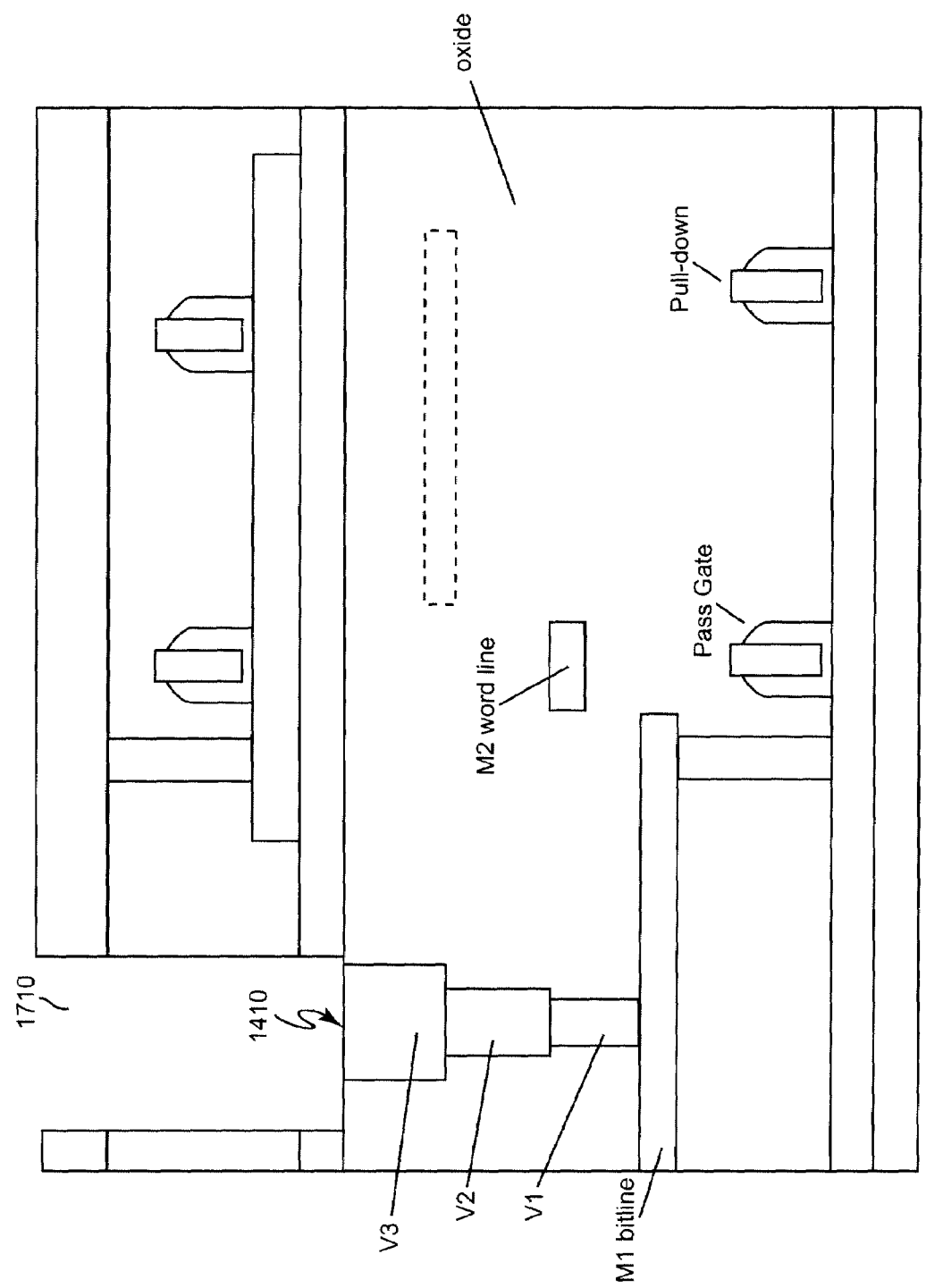
Figure 18:
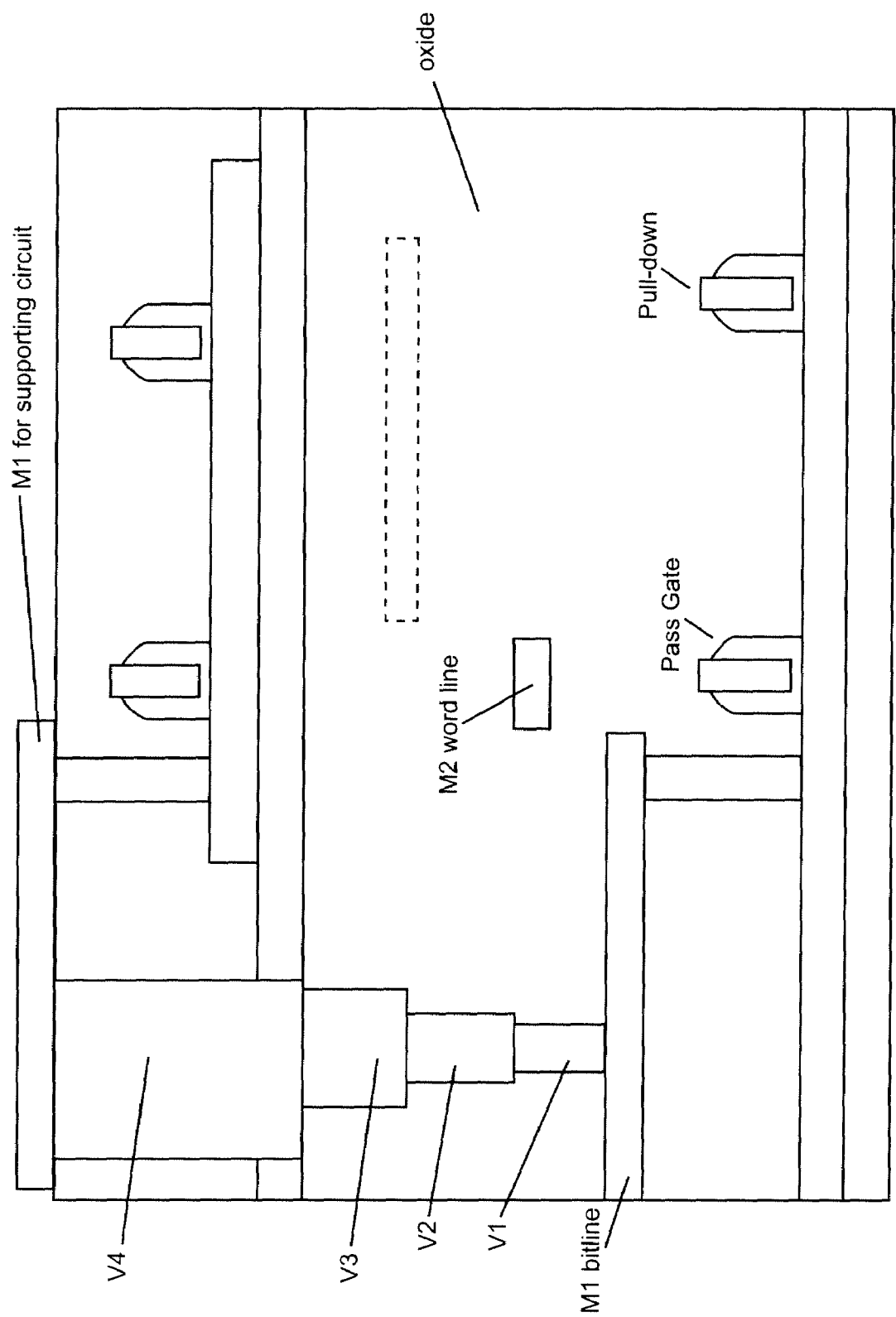

Referring now to FIG. 16, a resist (e.g. photoresist) layer 1610 is applied and patterned (1620) in non-critical, general registration with the bit line via structure 1410. Using this patterned resist, a contact hole 1710 is formed through the support circuit substrate. Then, as shown in FIG. 18, the resist is removed and conventional techniques may be used to form via structure V4 and first metal layer (M1) structures for the support circuits and to complete the wiring of the memory device. It should be noted that the process described above in connection with FIGS. 16-18 can be concurrently performed or repeated to form connections to the word lines WL of the second embodiment of the invention as described above.

Figure 19:
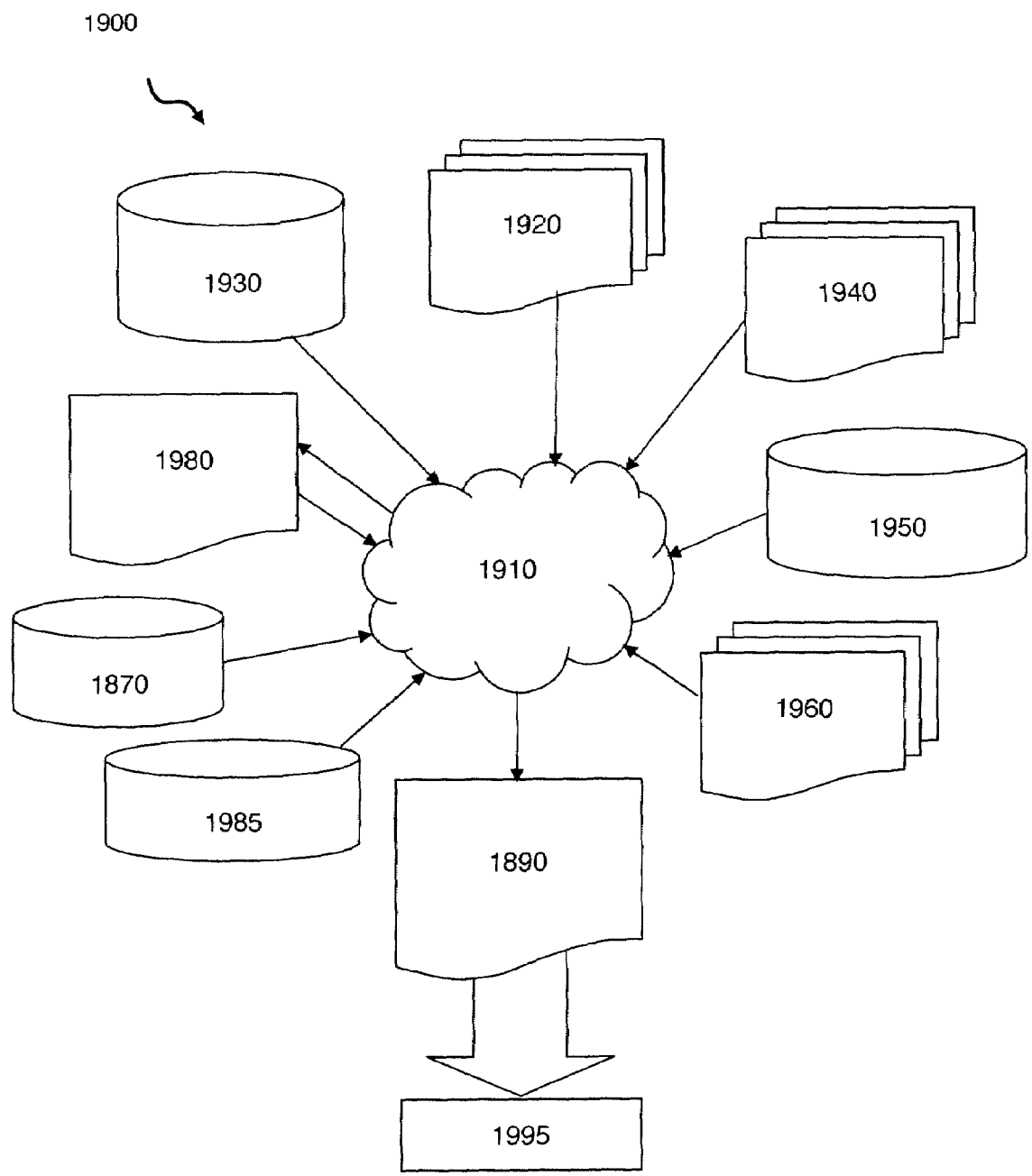
FIG. 19 is a flow diagram of a design process used in semiconductor design, manufacturing, and/or test.

FIG. 19 shows a block diagram of an example design flow 1900. Design flow 1900 may vary depending on the type of SRAM being designed. Design structure 1920 is preferably an input to a design process 1910 and may come from an IP provider, a core developer, or other design company or may be generated by the operator of the design flow, or from other sources. Design structure 1920 comprises the SRAM in the form of schematics or HDL, a hardware-description language (e.g., Verilog, VHDL, C, etc.). Design structure 1920 may be contained on one or more machine readable medium. For example, design structure 1920 may be a text file or a graphical representation of an SRAM. Design process 1910 preferably synthesizes (or translates) the SRAM into a netlist 1980, where netlist 1980 is, for example, a list of wires, transistors, logic gates, control circuits, I/O, models, etc. that describes the connections to other elements and circuits in an integrated circuit design and recorded on at least one of machine readable medium. This may be an iterative process in which netlist 1980 is resynthesized one or more times depending on design specifications and parameters for the circuit.

Design process 1910 may include using a variety of inputs; for example, inputs from library elements 1930 which may house a set of commonly used elements, circuits, and devices, including models, layouts, and symbolic representations, for a given manufacturing technology (e.g., different technology nodes, 32 nm, 45 nm, 90 nm, etc.), design specifications 1940, characterization data 1950, verification data 1960, design rules 1970, and test data files 1985 (which may include test patterns and other testing information). Design process 1910 may further include, for example, standard circuit design processes such as timing analysis, verification, design rule checking, place and route operations, etc. One of ordinary skill in the art of integrated circuit design can appreciate the extent of possible electronic design automation tools and applications used in design process 1910 without deviating from the scope and spirit of the invention. The design structure of the invention is not limited to any specific design flow.

Design process 1910 preferably translates an embodiment of the invention as shown in FIGS. 1-18, along with any additional integrated circuit design or data (if applicable), into a second design structure 1990. Design structure 1990 resides on a storage medium in a data format used for the exchange of layout data of integrated circuits (e.g. information stored in a GDSII (GDS2), GL1, OASIS, or any other suitable format for storing such design structures). Design structure 1990 may comprise information such as, for example, test data files, design content files, manufacturing data, layout parameters, wires, levels of metal, vias, shapes, data for routing through the manufacturing line, and any other data required by a semiconductor manufacturer to produce an embodiment of the invention as shown in FIGS. 1-18. Design structure 1990 may then proceed to a stage 1995 where, for example, design structure 1990: proceeds to tape-out, is released to manufacturing, is released to a mask house, is sent to another design house, is sent back to the customer, etc.

In view of the foregoing, it is seen that the memory device in accordance with the invention can achieve much increased memory cell density and storage capacity with improved functionality and performance by providing a solution to the instability problem of 6-T memory cells due to operation in a half-select mode. The number of bit lines or bit line pairs can be minimized and can effectively eliminate the half select mode of operation while providing much simplified sense amplifier design with reduced area requirements. Local evaluation circuits which provide isolation of the peripheral circuits and the memory cells may be provided in much greater numbers than sense amplifiers in prior designs and can be placed in the plane with the memory cells or removed to a second plane, minimizing connection length in either case) while leaving increased space for an increased number of sense amplifiers (reducing the number of bit lines sharing a given sense amplifier) to be placed in the second plane or removed to yet another plane; also with minimal connection length in either case. Manufacturing yield can be enhanced by facilitating separate testing and functionality verification for the memory array and support circuitry planes.

While the invention has been described in terms of a single preferred embodiment, those skilled in the art will recognize that the invention can be practiced with modification within the spirit and scope of the appended claims.

The invention claimed is:

1. A design structure embodied in a machine readable medium for designing, manufacturing, or testing a design for a design structure comprising an integrated circuit memory device, the design structure comprising:
    a memory cell array on a first chip in a first plane, said memory cell array including word lines and bit lines,
    at least one of word line decoder and sense amplifier type peripheral circuits on a second chip in a second plane overlying said first chip, at least one of word line decoder and said sense amplifier type peripheral circuits being generally in registration with a portion of a word line or a bit line, respectively,
    a local evaluation circuit in one of said first plane and said second plane and electrically connected between said word lines and a sense amplifier, and
    a connection from a word line or a bit line to a word line decoder or a sense amplifier, respectively, in a direction of a thickness of said first chip.

2. The design structure as recited in claim 1, said integrated circuit memory device further comprising a local evaluation circuit connected between said bit lines and said sense amplifiers.

3. The design structure as recited in claim 2 wherein said local evaluation circuit is located on a chip adjacent to said first chip.

4. The design structure as recited in claim 3 wherein said chip adjacent said first chip is said second chip.

5. The design structure as recited in claim 2, wherein said integrated circuit memory device of said design structure further comprising
a plurality of said local evaluation circuits,
means for sharing a said local evaluation circuit between a plurality of said memory cells, and
means for selecting a local evaluation circuit of said plurality of local evaluation circuits.

6. The design structure as recited in claim 5, wherein said integrated circuit memory device of said design structure further comprises
a plurality of said sense amplifiers,
means for sharing a said sense amplifier circuit among a plurality of said local evaluation circuits, and
means for selecting a said sense amplifier among said plurality of sense amplifiers.

7. The design structure as recited in claim 2, wherein said integrated circuit memory device of said design structure further comprises
a plurality of said sense amplifiers,
means for sharing a said sense amplifier circuit among a plurality of said local evaluation circuits, and
means for selecting a said sense amplifier among said plurality of sense amplifiers.

8. The design structure as recited in claim 1, wherein said word line decoder peripheral circuits are located in said second plane.

9. The design structure as recited in claim 3 wherein said word line decoder peripheral circuits are located in said chip adjacent said first chip.

10. The design structure as recited in claim 2 wherein said word line peripheral circuits are located on the same chip as said local evaluation circuit.

11. The design structure as recited in claim 1, wherein said local evaluation circuit includes a cross-coupled pair of transistors.

12. The design structure as recited in claim 1, wherein said sense amplifier includes an input circuit comprising an inverter.

13. The design structure of claim 1, wherein the design structure comprises a netlist, which describes the integrated memory device.

14. The design structure of claim 1, wherein the design structure resides on a storage medium as a data format used for the exchange of layout data of integrated circuits.

15. The design structure of claim 1, wherein the design structure includes at least one of test data files, characterization data, verification data, and design specifications.

* * * * *